US011335365B2

United States Patent
Inubushi et al.

(10) Patent No.: US 11,335,365 B2
(45) Date of Patent: *May 17, 2022

(54) MAGNETORESISTANCE EFFECT ELEMENT AND HEUSLER ALLOY

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/984,389

(22) Filed: Aug. 4, 2020

(65) Prior Publication Data
US 2021/0043226 A1    Feb. 11, 2021

(30) Foreign Application Priority Data

Aug. 8, 2019    (JP) .............................. JP2019-146332

(51) Int. Cl.
*G11B 5/39*    (2006.01)
*G01R 33/09*    (2006.01)
(Continued)

(52) U.S. Cl.
CPC .......... *G11B 5/3906* (2013.01); *G01R 33/093* (2013.01); *G11B 5/3903* (2013.01);
(Continued)

(58) Field of Classification Search
None
See application file for complete search history.

(56) References Cited

U.S. PATENT DOCUMENTS

| 8,320,080 B1* | 11/2012 | Braganca | ............... H01F 10/329 360/128 |
| 10,755,733 B1* | 8/2020 | Zheng | ................. G11B 5/1278 |

(Continued)

FOREIGN PATENT DOCUMENTS

| JP | 2008-112841 A | 5/2008 |
| JP | 6137577 B2 | 5/2017 |
| JP | 2019-062060 A | 4/2019 |

OTHER PUBLICATIONS

Jung et al., "Enhancement of magnetoresistance by inserting thin NiAl layers at the interfaces in Co2FeGa0.5Ge0.5/Ag/CO2FeGa0.5Ge0.5 current-perpendicular-to-plane pseudo spin valves," Applied Physics Letters, 2016, vol. 108, pp. 102408-1-102408-5.

(Continued)

*Primary Examiner* — Jefferson A Evans
(74) *Attorney, Agent, or Firm* — Oliff PLC

(57) ABSTRACT

A magnetoresistance effect element and a Heusler alloy in which a state change due to annealing does not easily occur. The element includes a first ferromagnetic layer, a second ferromagnetic layer, and a non-magnetic layer positioned between the first ferromagnetic layer and the second ferromagnetic layer, in which at least one of the first ferromagnetic layer and the second ferromagnetic layer is a Heusler alloy in which a portion of elements of an alloy represented by $Co_2Fe_\alpha Z_\beta$ is substituted with a substitution element, in which Z is one or more elements selected from the group consisting of Al, Si, Ga, Ge, and Sn, $\alpha$ and $\beta$ satisfy $2.3 \leq \alpha+\beta$, $\alpha<\beta$, and $0.5<\alpha<1.9$, and the substitution element is one or more elements selected from the group consisting of elements having a melting point higher than that of Fe among elements of Groups 4 to 10.

15 Claims, 9 Drawing Sheets

(51) Int. Cl.
*G11C 11/16* (2006.01)
*H01L 43/02* (2006.01)
*H01L 43/08* (2006.01)
*H01L 43/10* (2006.01)

(52) U.S. Cl.
CPC ............ *G11C 11/161* (2013.01); *H01L 43/02* (2013.01); *H01L 43/08* (2013.01); *H01L 43/10* (2013.01)

(56) References Cited

U.S. PATENT DOCUMENTS

| | | | | |
|---|---|---|---|---|
| 10,804,671 | B1* | 10/2020 | Kirchner | H01S 1/02 |
| 2008/0100969 | A1 | 5/2008 | Mizuno et al. | |
| 2009/0268353 | A1 | 10/2009 | Carey et al. | |
| 2013/0014798 | A1* | 1/2013 | Nishide | H01L 35/32 |
| | | | | 136/205 |
| 2015/0010780 | A1* | 1/2015 | Carey | G11B 5/3929 |
| | | | | 428/811.3 |
| 2015/0116867 | A1 | 4/2015 | Childress et al. | |
| 2015/0311305 | A1 | 10/2015 | Ishikawa et al. | |
| 2016/0019917 | A1* | 1/2016 | Du | H01L 43/08 |
| | | | | 428/811.2 |
| 2016/0380185 | A1* | 12/2016 | Kato | H01L 27/228 |
| | | | | 257/421 |
| 2017/0221507 | A1* | 8/2017 | Furubayashi | H01L 43/10 |
| 2018/0254409 | A1 | 9/2018 | Nakada et al. | |
| 2018/0301611 | A1* | 10/2018 | Fukatani | H01L 35/20 |
| 2018/0342668 | A1* | 11/2018 | Inubushi | H01L 43/08 |
| 2019/0094315 | A1 | 3/2019 | Inubushi et al. | |
| 2019/0164587 | A1* | 5/2019 | Machida | G11B 5/3909 |
| 2020/0158796 | A1* | 5/2020 | Ikhtiar | H01F 41/325 |
| 2020/0321393 | A1* | 10/2020 | Manipatruni | H01L 43/12 |
| 2020/0403149 | A1* | 12/2020 | Guisan | H01L 43/10 |
| 2021/0043682 | A1* | 2/2021 | Nakada | H01L 27/222 |

OTHER PUBLICATIONS

Goripati et al., "Bi-quadratic interlayer exchange coupling in CO2MnSi/Ag/CO2MnSi pseudo spin-valve," Journal of Applied Physics, 2011, vol. 110, p. 123914-1-123914-7.

Furubayashi et al., "Structure and transport properties of current-perpendicular-to-plane spin valves using CO2FeAl0.5Si0.5 and C02MnSi Heusler alloy electrodes," Journal of Applied Physics, 2010, vol. 107, pp. 113917-1-113917-7.

Iwase et al., "Large Interface Spin-Asymmetry and Magnetoresistance in Fully Epitaxial CO2MnSi/Ag/CO2MnSi Current-Perpendicular-to-Plane Magnetoresistive Devices," Applied Physics Express 2, 2009, pp. 063003-1-063003-3.

J.W. Jung et al. "Enhancement of Magnetoresistance By Inserting Thin NiAl Layers at the Interfaces In Co2FeGa0.5Ge0.5/Ag/Co2FeGa0.5Ge0.5 Current-Perpendicular-To-Plane Pseudo Spin Valves". Applied Physics Letters, vol. 108, 2016, p. 102408-1 through 102408-5.

Hari S. Goripati et al. "Bi-Quadratic Interlayer Exchange Coupling In Co2MnSi/Ag/Co2MnSi Pseudo Spin-Valve". Journal of Applied Physics, vol. 110, 2011, pp. 123914-1 through 123914-7.

T. Furubayashi et al. "Structure and Transport Properties of Current-Perpendicular-To-Plane Spin Valves Using Co2FeAl0.5Si0.5 and Co2MnSi Heusler Alloy Electrodes". Journal of Applied Physics, vol. 107, 2010, pp. 113917-1 through 113917-7.

Taku Iwase et al. "Large Interface Spin-Asymmetry and Magnetoresistance in Fully Epitaxial Co2MnSi/Ag/Co2MnSi Current-Perpendicular-To-Plane Magnetoresistive Devices". Applied Physics Express, vol. 2, 2009, pp. 063003-1 through 063003-3.

Mar. 29, 2021 Search Report issued in European Patent Application No. 20189904.4.

Mar. 30, 2022 Office Action issued in U.S. Appl. No. 16/986,431.

\* cited by examiner

MAGNETORESISTANCE EFFECT ELEMENT AND HEUSLER ALLOY

BACKGROUND OF THE INVENTION

Field of the Invention

The present disclosure relates to a magnetoresistance effect element and a Heusler alloy.

Priority is claimed on Japanese Patent Application No. 2019-146332 filed in Japan on Aug. 8, 2019, the content of which is incorporated herein by reference.

Description of Related Art

A magnetoresistance effect element is an element whose resistance value changes in a lamination direction due to a magnetoresistance effect. A magnetoresistance effect element includes two ferromagnetic layers and a non-magnetic layer sandwiched therebetween. A magnetoresistance effect element in which a conductor is used for a non-magnetic layer is called a giant magnetoresistance (GMR) element, and a magnetoresistance effect element in which an insulating layer (a tunnel barrier layer, a barrier layer) is used for a non-magnetic layer is called a tunnel magnetoresistance (TMR) element. The magnetoresistance effect element can be applied in various applications such as magnetic sensors, high-frequency components, magnetic heads, and magnetic random access memories (MRAMs).

Non-Patent Document 1 describes an example in which a $Co_2FeGa_{0.5}Ge_{0.5}$ alloy, which is a Heusler alloy, is used for a ferromagnetic layer of the GMR element.

Non-Patent Documents

[Non-patent Document 1] Appl. Phys. Lett. 108, 102408 (2016).

SUMMARY OF THE INVENTION

A Heusler alloy has been studied as a material that has a high likelihood of achieving a spin polarization of 100% at room temperature. A Heusler alloy has a high spin polarization and is theoretically expected as a material capable of exhibiting a high magnetoresistance ratio (MR ratio). However, even when a Heusler alloy is used for a ferromagnetic layer of a magnetoresistance effect element, the magnetoresistance effect element cannot achieve the expected MR ratio.

The present disclosure has been made in view of the above circumstances, and an objective of the present disclosure is to provide a magnetoresistance effect element and a Heusler alloy in which a state change due to annealing does not easily occur.

A magnetoresistance effect element is subjected to an annealing treatment during a manufacturing process. A magnetoresistance effect element is subjected to, for example, an annealing treatment for enhancing crystalline properties of each layer, or an annealing treatment that is performed when it is mounted on an integrated circuit. There are cases in which elements constituting the Heusler alloy diffuse during annealing, thereby causing a change in composition or crystal structure. A change in composition or crystal structure of the Heusler alloy causes a decrease in an MR ratio of the magnetoresistance effect element. Therefore, the inventors of the present disclosure have found that, when a portion of elements constituting a Heusler alloy is substituted with an element having a higher melting point than that of Fe, a state of the Heusler alloy does not easily change due to annealing, and the MR ratio of the magnetoresistance effect element is not easily decreased. The present disclosure provides the following means in order to solve the above problems.

[1] A magnetoresistance effect element according to a first aspect includes a first ferromagnetic layer, a second ferromagnetic layer, and a non-magnetic layer positioned between the first ferromagnetic layer and the second ferromagnetic layer, in which at least one of the first ferromagnetic layer and the second ferromagnetic layer is a Heusler alloy in which a portion of elements of an alloy represented by $Co_2Fe_\alpha Z_\beta$ is substituted with a substitution element, in which Z is one or more elements selected from the group consisting of Al, Si, Ga, Ge, and Sn, α and β satisfy 2.3≤α+β, α<β, and 0.5<α<1.9, and the substitution element is one or more elements selected from the group consisting of elements having a melting point higher than that of Fe among elements of Groups 4 to 10.

[2] In the magnetoresistance effect element according to the above aspect, the Heusler alloy may be represented by the following general expression (1).

$$Co_2(Fe_{1-a}Y1_a)_\alpha Z_\beta \quad (1)$$

In expression (1), Y1 is the substitution element, and a satisfies 0<a<0.5.

[3] In the magnetoresistance effect element according to the above aspect, the substitution element may be one or more elements selected from the group consisting of Zr, Nb, Mo, Ru, Rh, Pd, Hf, Ta, W, Re, Os, Ir, and Pt.

[4] In the magnetoresistance effect element according to the above aspect, the substitution element may be one or more elements selected from the group consisting of Hf, Ta, W, Re, Os, Ir, and Pt.

[5] In the magnetoresistance effect element according to the above aspect, the Heusler alloy may be represented by the following general expression (2).

$$Co_2(Fe_{1-a}Y1_a)_\alpha(Ga_{1-b}Z1_b)_\beta \quad (2)$$

In expression (2), Y1 is the substitution element, Z1 is one or more elements selected from the group consisting of Al, Si, Ge, and Sn, and 0<a<0.5 and 0.1≤β(1−b) are satisfied.

[6] In the magnetoresistance effect element according to the above aspect, b in general expression (2) satisfies b>0.5.

[7] In the magnetoresistance effect element according to the above aspect, the Heusler alloy may be represented by the following general expression (3).

$$Co_2(Fe_{1-a}Y1_a)_\alpha(Ge_{1-c}Z2_c)_\beta \quad (3)$$

In expression (3), Y1 is the substitution element, Z2 is one or more elements selected from the group consisting of Al, Si, Ga, and Sn, and 0<a<0.5 and 0.1<β(1−c) are satisfied.

[8] In the magnetoresistance effect element according to the above aspect, c in general expression (3) may satisfy c<0.5.

[9] In the magnetoresistance effect element according to the above aspect, Z2 may be Ga.

[10] In the magnetoresistance effect element according to the above aspect, α and β may satisfy 2.3≤α+β<2.66.

[11] In the magnetoresistance effect element according to the above aspect, α and β may satisfy 2.45<α+β<2.66.

[12] In the magnetoresistance effect element according to the above aspect, the non-magnetic layer may be configured to contain Ag.

[13] In the magnetoresistance effect element according to the above aspect, a NiAl layer containing a NiAl alloy may be configured to be provided between the first ferromagnetic layer and the non-magnetic layer and between the second ferromagnetic layer and the non-magnetic layer.

[14] In the magnetoresistance effect element according to the above aspect, a thickness t of the NiAl layer may be 0<t≤0.63 nm.

[15] A Heusler alloy according to a second aspect is a Heusler alloy in which a portion of elements of an alloy represented by $Co_2Fe_\alpha Z_\beta$ is substituted with a substitution element, wherein Z is one or more elements selected from the group consisting of Al, Si, Ga, Ge, and Sn, $\alpha$ and $\beta$ satisfy $2.3 \leq \alpha+\beta$, $\alpha<\beta$, and $0.5<\alpha<1.9$, and the substitution element is one or more elements selected from the group consisting of elements having a melting point higher than that of Fe among elements of Groups 4 to 10.

A Heusler alloy in which a state change due to annealing does not easily occur can be obtained.

DETAILED DESCRIPTION OF THE INVENTION

Figure 1:
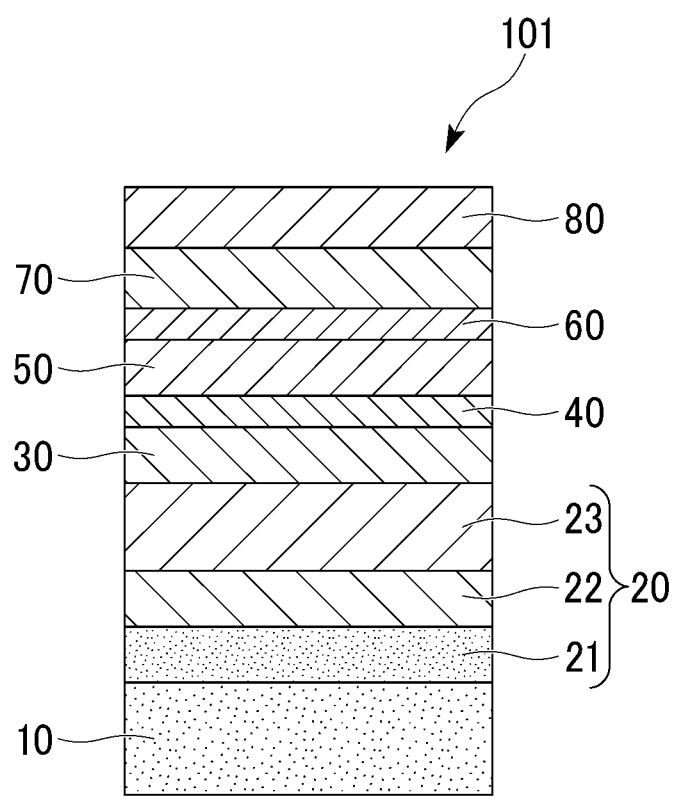
FIG. 1 is a cross-sectional view of a magnetoresistance effect element according to a first embodiment.

Hereinafter, the present embodiment will be described in detail with reference to the drawings as appropriate. In the drawings used in the following description, there are cases in which characteristic portions are appropriately enlarged for convenience of illustration so that characteristics of the present embodiment can be easily understood, and dimensional proportions of respective constituent elements may be different from actual ones. Materials, dimensions, and the like illustrated in the following description are merely examples, and the present disclosure is not limited thereto and can be implemented with appropriate modifications within a range not departing from the gist of the present disclosure.

First Embodiment

FIG. 1 is a cross-sectional view of the magnetoresistance effect element according to a first embodiment. FIG. 1 is a cross-sectional view of the magnetoresistance effect element 101 along a lamination direction of each layer of the magnetoresistance effect element. The magnetoresistance effect element 101 includes underlayers 20, a first ferromagnetic layer 30, a first NiAl layer 40, a non-magnetic layer 50, a second NiAl layer 60, a second ferromagnetic layer 70, and a cap layer 80 on a substrate 10. The non-magnetic layer 50 is positioned between the first ferromagnetic layer 30 and the second ferromagnetic layer 70. The first NiAl layer 40 is positioned between the first ferromagnetic layer 30 and the non-magnetic layer 50. The second NiAl layer 60 is positioned between the non-magnetic layer 50 and the second ferromagnetic layer 70.

(Substrate)

The substrate 10 is a portion serving as a base of the magnetoresistance effect element 101. It is preferable to use a highly flat material for the substrate 10. The substrate 10 may include, for example, a metal oxide single crystal, a silicon single crystal, a silicon single crystal with a thermal oxide film, a sapphire single crystal, a ceramic, quartz, and glass. The material contained in the substrate 10 is not particularly limited as long as it is a material having an appropriate mechanical strength and is suitable for heat treatment and microfabrication. As the metal oxide single crystal, a MgO single crystal is an exemplary example. An epitaxial growth film can be easily formed on a substrate containing a MgO single crystal using, for example, a sputtering method. A magnetoresistance effect element using the epitaxial growth film exhibits large magnetoresistance characteristics. Types of the substrate 10 differ depending on intended products. When a product is a magnetic random access memory (MRAM), the substrate 10 may be, for example, a Si substrate having a circuit structure. When a product is a magnetic head, the substrate 10 may be, for example, an AlTiC substrate that is easy to process.

(Underlayer)

The underlayers 20 are positioned between the substrate 10 and the first ferromagnetic layer 30. The underlayers 20 may include, for example, a first underlayer 21, a second underlayer 22, and a third underlayer 23 in order from a position near the substrate 10.

The first underlayer 21 is a buffer layer which alleviates a difference between a lattice constant of the substrate 10 and a lattice constant of the second underlayer 22. A material of the first underlayer 21 may be either a conductive material or an insulating material. The material of the first underlayer 21 also differs depending on a material of the substrate 10 and a material of the second underlayer 22, but may be, for example, a compound having a (001)-oriented NaCl structure. The compound having an NaCl structure may be, for example, a nitride containing at least one element selected from the group consisting of Ti, Zr, Nb, V, Hf, Ta, Mo, W, B, Al, and Ce, or an oxide containing at least one element selected from the group consisting of Mg, Al, and Ce.

The material of the first underlayer 21 may also be, for example, a (002)-oriented perovskite-based conductive oxide represented by a compositional formula of $ABO_3$. The perovskite-based conductive oxide may be, for example, an oxide containing at least one element selected from the group consisting of Sr, Ce, Dy, La, K, Ca, Na, Pb, and Ba as the site A and containing at least one element selected from the group consisting of Ti, V, Cr, Mn, Fe, Co, Ni, Ga, Nb, Mo, Ru, Ir, Ta, Ce, and Pb as the site B.

The second underlayer 22 is a seed layer that enhances crystalline properties of an upper layer laminated on the second underlayer 22. The second underlayer 22 may contain, for example, at least one selected from the group consisting of MgO, TiN, and NiTa alloys. The second underlayer 22 may be, for example, an alloy containing Co and Fe. The alloy containing Co and Fe may be, for example, Co—Fe or Co—Fe—B.

The third underlayer 23 is a buffer layer which alleviates a difference between a lattice constant of the second underlayer 22 and a lattice constant of the first ferromagnetic layer 30. The third underlayer 23 may contain, for example, a metal element when it is used as an electrode for causing a detection current to flow therethrough. The metal element may be, for example, at least one selected from the group consisting of Ag, Au, Cu, Cr, V, Al, W, and Pt. The third underlayer 23 may be a layer containing any one of a metal, an alloy, an intermetallic compound, a metal boride, a metal carbide, a metal silicide, and a metal phosphide which have a function of generating a spin current due to a spin Hall effect when a current flows therethrough. Further, the third underlayer 23 may be a layer having, for example, a (001)-oriented tetragonal crystal structure or a cubic crystal structure and containing at least one element selected from the group consisting of Al, Cr, Fe, Co, Rh, Pd, Ag, Ir, Pt, Au, Mo, and W. The third underlayer 23 may be an alloy of these metal elements or a laminate of materials consisting of two or more types of these metal elements. The alloy of metal elements may include, for example, a cubic crystal based AgZn alloy, AgMg alloy, CoAl alloy, FeAl alloy, and NiAl alloy.

The underlayers 20 function as buffer layers which alleviate a difference in lattice constants between the substrate 10 and the first ferromagnetic layer 30 and enhance crystalline properties of an upper layer formed on the underlayers 20. The first underlayer 21, the second underlayer 22, and third underlayer 23 may be omitted. That is, the underlayers 20 may be omitted or may be one layer or two layers. Also, among the first underlayer 21, the second underlayer 22, and the third underlayer 23, there may be layers formed of the same material. Also, the underlayers 20 are not limited to the three layers and may be four or more layers.

(First Ferromagnetic Layer and Second Ferromagnetic Layer)

The first ferromagnetic layer 30 and the second ferromagnetic layer 70 are magnetic materials. The first ferromagnetic layer 30 and the second ferromagnetic layer 70 each have magnetization. The magnetoresistance effect element 101 outputs a change in a relative angle between magnetization of the first ferromagnetic layer 30 and magnetization of the second ferromagnetic layer 70 as a change in a resistance value.

Magnetization of the second ferromagnetic layer 70 is easier to move than magnetization of the first ferromagnetic layer 30. When a predetermined external force is applied, a magnetization direction of the first ferromagnetic layer 30 does not change (is fixed) while a magnetization direction of the second ferromagnetic layer 70 changes. When the magnetization direction of the second ferromagnetic layer 70 changes with respect to the magnetization direction of the first ferromagnetic layer 30, a resistance value of the magnetoresistance effect element 101 changes. In this case, the first ferromagnetic layer 30 may be called a magnetization fixed layer, and the second ferromagnetic layer 70 may be called a magnetization free layer. Hereinafter, a case in which the first ferromagnetic layer 30 is the magnetization fixed layer and the second ferromagnetic layer 70 is the magnetization free layer will be described as an example, but this relationship may be reversed.

A difference in ease of movement between the magnetization of the first ferromagnetic layer 30 and the magnetization of the second ferromagnetic layer 70 when a predetermined external force is applied is caused by a difference in coercivity between the first ferromagnetic layer 30 and the second ferromagnetic layer 70. For example, when a thickness of the second ferromagnetic layer 70 is made smaller than a thickness of the first ferromagnetic layer 30, a coercivity of the second ferromagnetic layer 70 becomes smaller than a coercivity of the first ferromagnetic layer 30. Also, for example, an antiferromagnetic layer may be provided on a surface of the first ferromagnetic layer 30 on a side opposite to the non-magnetic layer 50 with a spacer layer interposed therebetween. The first ferromagnetic layer 30, the spacer layer, and the antiferromagnetic layer form a synthetic antiferromagnetic structure (SAF structure). The synthetic antiferromagnetic structure is formed of two magnetic layers sandwiching a spacer layer therebetween. When the first ferromagnetic layer 30 and the antiferromagnetic layer are antiferromagnetically coupled, a coercivity of the first ferromagnetic layer 30 becomes larger than that in a case without the antiferromagnetic layer. The antiferromagnetic layer may be, for example, IrMn, PtMn, or the like. The spacer layer may contain, for example, at least one selected from the group consisting of Ru, Ir, and Rh.

The first ferromagnetic layer 30 and the second ferromagnetic layer 70 are Heusler alloys. A Heusler alloy is a half metal in which electrons passing through the non-magnetic layer 50 have only upward or downward spins and which ideally exhibits a spin polarization of 100%.

A ferromagnetic Heusler alloy represented by $X_2YZ$ is called a full Heusler alloy and is a typical intermetallic compound based on a bcc structure. The ferromagnetic Heusler alloy represented by $X_2YZ$ has a crystal structure of any one of an $L2_1$ structure, a B2 structure, and an A2 structure. Compounds represented by the compositional formula $X_2YZ$ have properties of becoming increasingly crystalline in the order of $L2_1$ structure>B2 structure>A2 structure.

Figure 2A:
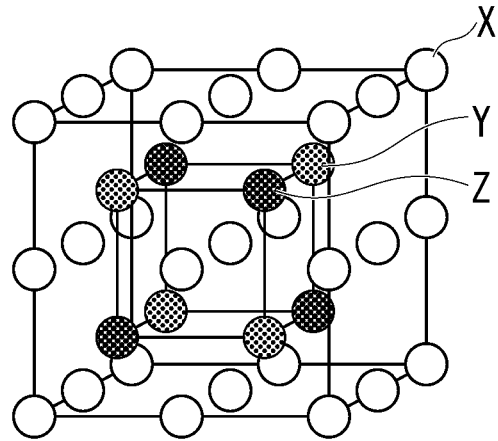
FIG. 2A is an example of a crystal structure of a Heusler alloy represented by a compositional formula of $X_2YZ$ and having an $L2_1$ structure.
Figure 2B:
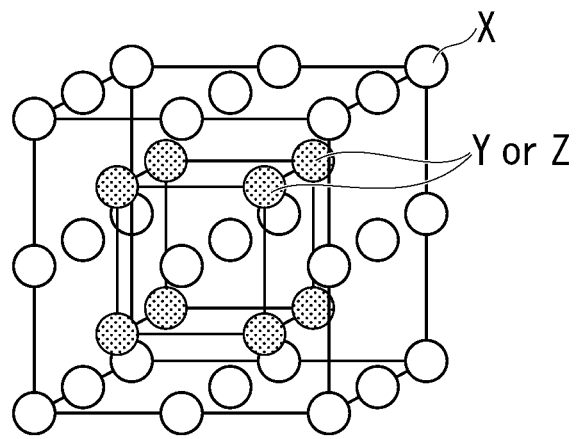
FIG. 2B is an example of a crystal structure of a Heusler alloy represented by a compositional formula of $X_2YZ$ and having a B2 structure derived from the $L2_1$ structure.
Figure 2C:
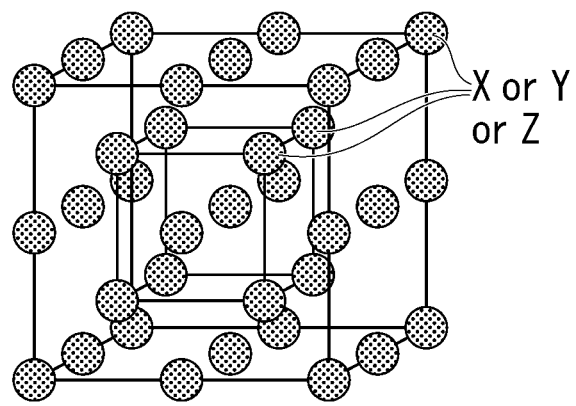
FIG. 2C is an example of a crystal structure of a Heusler alloy represented by a compositional formula of $X_2YZ$ and having an A2 structure derived from the $L2_1$ structure.

FIGS. 2A to 2C are examples of crystal structures of a Heusler alloy represented by the compositional formula of $X_2YZ$, in which FIG. 2A is a crystal of a Heusler alloy having an $L2_1$ structure, FIG. 2B is a B2 structure derived from the $L2_1$ structure, and FIG. 2C is an A2 structure derived from the $L2_1$ structure. In the $L2_1$ structure, an element entering the X site, an element entering the Y site, and an element entering the Z site are fixed. In the B2 structure, an element entering the Y site and an element entering the Z site are mixed, and an element entering the X site is fixed. In the A2 structure, an element entering the X site, an element entering the Y site, and an element entering the Z site are mixed.

In the Heusler alloy according to the present embodiment, $\alpha$ and $\beta$ satisfy $2.3 \leq \alpha+\beta$. $\alpha$ is the number of Fe elements when the number of Co elements is 2 in a state before substitution, and $\beta$ is the number of Z elements when the number of Co elements is 2 in a state before substitution. In a state after substitution, for example, $\alpha$ is the numbers of Fe elements and substitution elements when the number of Co elements is 2, and β is the number of Z elements to be described below when the number of Co elements is 2. The Heusler alloy according to the present embodiment is out of a stoichiometric composition (α+β=2) of the Heusler alloy of X$_2$YZ illustrated in FIG. 2A. As will be shown in examples to be described below, when a composition of the Heusler alloy is intentionally caused to be out of the stoichiometric composition, a magnetoresistance (MR) ratio W, Re, Os, Ir, and Pt. A crystal structure of the Heusler alloy can be maintained even when an element of Groups 4 to 10 is substituted with the Fe element. Also, there is a tendency for a higher period in the periodic table to correspond to a higher melting point.

Here, "melting point" indicates a melting point in a case in which an element is formed as a crystal and exists as a single metal. For example, a melting point of Fe is 1538° C. Also, melting points of the elements of Groups 4 to 10 are shown in table 1 below.

TABLE 1

|  |  | Group 4 | Group 5 | Group 6 | Group 7 | Group 8 | Group 9 | Group 10 |
|---|---|---|---|---|---|---|---|---|
| Period 4 | Element | Ti | V | Cr | Mn | Fe | Co | Ni |
|  | Melting point (° C.) | 1668 | 1910 | 1907 | 1246 | 1538 | 1495 | 1455 |
| Period 5 | Element | Zr | Nb | Mo | Tc | Ru | Rh | Pd |
|  | Melting point (° C.) | 1855 | 2468 | 2623 | 2157 | 2334 | 1964 | 1554 |
| Period 6 | Element | Hf | Ta | W | Re | Os | Ir | Pt |
|  | Melting point (° C.) | 2233 | 2985 | 3422 | 3186 | 3033 | 2466 | 1768 | tends to be maintained even after an annealing treatment. When a value of α+β becomes excessive with respect to the stoichiometric composition, there is a likelihood that a magnetoresistance (MR) ratio will be maintained even when element diffusion occurs. For α+β, it is preferable that 2.3≤α+β<2.66, and particularly preferable that 2.45<α+β<2.66.

In the Heusler alloy according to the present embodiment, α and β satisfy a relationship of α<β. There are cases in which the Fe element is substituted with an element of a Co element site. The substitution of the Fe element for the Co element site is called antisite. The antisite causes a variation in a Fermi level of the Heusler alloy. When the Fermi level varies, half-metal characteristics of the Heusler alloy deteriorate, and a spin polarization thereof decreases. The decrease in spin polarization causes a decrease in the MR ratio of the magnetoresistance effect element 101. For α and β, it is preferable that α<β<2×α, and particularly preferable that α<β<1.5×α. When β does not become too large with respect to α, disturbing in a crystal structure of the Heusler alloy can be suppressed, and a decrease in the MR ratio of the magnetoresistance effect element 101 can be suppressed.

Also, in the Heusler alloy according to the present embodiment, α satisfies a relationship of 0.5<α<1.9. In order to suppress the antisite, for α, it is preferable that 0.8<α<1.33, and particularly preferable that 0.9<α<1.2.

Also, in the Heusler alloy according to the present embodiment, some elements of an alloy represented by Co$_2$Fe$_\alpha$Z$_\beta$ is substituted with a substitution element. The Z element is one or more elements selected from the group consisting of Al, Si, Ga, Ge, and Sn. The substitution element is substituted with any one of the Co element, the Fe element, and the Z element. The substitution element is mainly substituted with the Fe element.

The substitution element is one or more elements selected from the group consisting of elements having a melting point higher than that of Fe among elements of Groups 4 to 10 in the periodic table. The substitution element is, for example, one or more elements selected from the group consisting of Zr, Nb, Mo, Ru, Rh, Pd, Hf, Ta, W, Re, Os, Ir, and Pt. Also, the substitution element is preferably one or more elements selected from the group consisting of Hf, Ta, When a portion of the Heusler alloy is substituted with an element having a melting point higher than that of Fe among elements of Groups 4 to 10, a melting point of the whole Heusler alloy increases. Therefore, diffusion of the elements constituting the Heusler alloy can be suppressed.

The Heusler alloy according to the present embodiment may be represented by, for example, the following general expression (1).

$$\text{Co}_2(\text{Fe}_{1-a}\text{Y1}_a)_\alpha \text{Z}_\beta \qquad (1)$$

In expression (1), Y1 is a substitution element. a satisfies 0<a<0.5.

Also, the Heusler alloy according to the present embodiment may be represented by, for example, the following general expression (2).

$$\text{Co}_2(\text{Fe}_{1-a}\text{Y1}_a)_\alpha (\text{Ga}_{1-b}\text{Z1}_b)_\beta \qquad (2)$$

In expression (2), Y1 is a substitution element, and Z1 is one or more elements selected from the group consisting of Al, Si, Ge, and Sn. General expression (2) satisfies 0<a<0.5 and 0.1≤β(1−b). General expression (2) corresponds to a case in which a portion of the Z element in general expression (1) is Ga.

Ga contributes to ordering of the crystal structure of the Heusler alloy at a low temperature. When the number of Co elements is 2, if Ga is contained in an amount of 0.1 or more, the Heusler alloy is easily ordered even at a low temperature. When a crystal structure of the Heusler alloy is ordered, constituent elements thereof do not easily diffuse into the other layers. On the other hand, an abundance ratio of the Ga element is preferably smaller than an abundance ratio of the Z1 element. That is, it is preferable that b>0.5 be satisfied. Ga has a low melting point, and when too much Ga is contained in the Heusler alloy, a melting point of the Heusler alloy may be lowered, and Ga may diffuse into other layers.

The Heusler alloy according to the present embodiment may be represented by, for example, the following general expression (3).

$$\text{Co}_2(\text{Fe}_{1-a}\text{Y1}_a)_\alpha (\text{Ge}_{1-c}\text{Z2}_c)_\beta \qquad (3)$$

In expression (3), Y1 is a substitution element, and Z2 is one or more elements selected from the group consisting of Al, Si, Ga, and Sn. General expression (3) satisfies 0<a<0.5 and 0.1≤β(1−c).

Ge is a semiconductor element and has an effect of increasing resistivity of the Heusler alloy. When the Heusler alloy contains Ge, Resistance Area product (RA) of the magnetoresistance effect element increases. For example, a magnetic domain wall movement element to be described below or the like is required to have a large RA. The Ge element is preferably contained in an amount of 0.1 or more when the number of Co elements is 2. An abundance ratio of the Ge element is preferably higher than an abundance ratio of the Z2 element. That is, it is preferable that $c<0.5$ be satisfied. On the other hand, when the abundance ratio of the Ge element is too large, the resistivity of the Heusler alloy increases and becomes a parasitic resistance component of the magnetoresistance effect element 101. For $\beta(1-c)$, it is more preferable that $0.63<\beta(1-c)<1.26$, and particularly preferable that $0.84<\beta(1-c)<1.26$.

Also, in general expression (3) described above, the Z2 element may be Ga. In this case, general expression (3) is represented by the following general expression (4).

$$Co_2(Fe_{1-a}Y1_a)_\alpha(Ge_{1-c}Ga_c)_\beta \quad (4)$$

In expression (4), Y1 is a substitution element. General expression (4) satisfies $0<a<0.5$, $0.1\leq\beta(1-c)$, and $0.1<\beta c$.

The Heusler alloy of general expression (4) contains Ga and Ge as the Z element. In the Heusler alloy of general expression (4), characteristics as a half metal are enhanced by a synergistic effect of Ga and Ge, and thus a spin polarization thereof is improved. The magnetoresistance effect element 101 using the Heusler alloy of general expression (4) is further increased in the MR ratio due to the above-described synergistic effect of Ga and Ge.

In general expression (4), an abundance ratio of the Ge element is preferably higher than an abundance ratio of the Ga element. Also, it is more preferable that general expression (4) satisfy $0.63<\beta(1-c)<1.26$ and particularly preferable that it satisfy $0.84<\beta(1-c)<1.26$.

Also, in general expression (3) described above, the Z2 element may be Ga or Mn. In this case, general expression (3) is represented by the following general expression (5).

$$Co_2(Fe_{1-a}Y1_a)_\alpha(Ge_{1-c}Ga_dMn_e)_\beta \quad (5)$$

In expression (5), Y1 is a substitution element. General expression (5) satisfies $0<a<0.5$, $d+e=c>0$, $0.1\leq\beta(1-c)$, $0.1\leq\beta d$, and $0.1\leq\beta c$.

Mn has an effect of increasing the MR ratio of the magnetoresistance effect element 101 when it coexists with Ga and Ge. Even when the Mn element is substituted for the Co element site, half metal characteristics are not easily deteriorated. In general expression (5), an abundance ratio of the Mn element is preferably higher than an abundance ratio of the Ge element. Also, an abundance ratio of the Ga element is preferably higher than an abundance ratio of the Ge element. Specifically, it is preferable that $\beta(1-c)$ satisfy $0.4<\beta(1-c)<0.6$, $\beta d$ satisfy $0.2<\beta d<0.4$, and $\beta e$ satisfy $0.65<\beta e<0.80$. When the Heusler alloy contains Ga, Ge, and Mn, effects due to the respective elements are exhibited, and thereby the MR ratio of the magnetoresistance effect element 101 is further increased.

In the Heusler alloy according to the present embodiment, a portion of the Heusler alloy is substituted with an element having a melting point higher than that of Fe among elements of Groups 4 to 10, and a melting point of the whole Heusler alloy increases. As a result, the elements constituting the Heusler alloy do not easily diffuse into other layers even when they are subjected to a treatment such as annealing. That is, in the Heusler alloy, the composition or the crystal structure is not easily changed even after it undergoes annealing or the like and its state can be maintained.

Here, a case in which both the first ferromagnetic layer 30 and the second ferromagnetic layer 70 are specific Heusler alloys has been described as an example, but only one of the first ferromagnetic layer 30 and the second ferromagnetic layer 70 may be a specific Heusler alloy. In this case, a ferromagnetic material forming the other of the first ferromagnetic layer 30 or the second ferromagnetic layer 70 may contain, for example, a metal selected from the group consisting of Cr, Mn, Co, Fe, and Ni, an alloy containing one or more of these metals, or an alloy containing these metals and at least one element of B, C, and N. Among these ferromagnetic materials, Co—Fe and Co—Fe—B are preferable.

A composition of the Heusler alloy can be measured by an X-ray fluorescence (XRF) method, an inductively coupled plasma (ICP) emission spectroscopy method, an energy dispersive X-ray spectroscopy (EDS) method, a secondary ion mass spectrometry (SIMS) method, an Auger electron spectroscopy (AES) method, or the like.

A crystal structure of the Heusler alloy can be measured by an X-ray diffraction (XRD) method, a reflection high-energy electron diffraction (RHEED) method, or the like. For example, in a case of the XRD, when the Heusler alloy has the $L2_1$ structure, peaks of (200) and (111) are shown, but when the Heusler alloy has the B2 structure, a (200) peak is shown but a (111) peak is not shown. For example, in a case of RHEED, when the Heusler alloy has the $L2_1$ structure, streaks of (200) and (111) are shown, but when the Heusler alloy has the B2 structure, a (200) streak is shown, but a (111) streak is not shown.

Identification of a site of the substitution element can be measured using an X-ray absorption spectroscopy (XAS) method, an X-ray magnetic circular dichroism (XMCD), a nuclear magnetic resonance (NMR) method, or the like. For example, in a case of the XAS, it suffices to observe an absorption end of Co or Fe.

The composition, the crystal structure, and the site identification may be analyzed during (in-situ) or after fabrication of the magnetoresistance effect element 101, or may be analyzed using one in which only the Heusler alloy is formed on a base material. In a case of the latter, it is preferable that a base material formed of a material that does not contain elements contained in the Heusler alloy be selected and the film thickness of the Heusler alloy be set to about 2 nm to 50 nm although it depends on resolution of analytical instruments.

(First NiAl Layer and Second NiAl Layer)

The first NiAl layer 40 and the second NiAl layer 60 are layers containing a NiAl alloy. The first NiAl layer 40 is a buffer layer that alleviates lattice mismatching between the first ferromagnetic layer 30 and the non-magnetic layer 50. The second NiAl layer 60 is a buffer layer that alleviates lattice mismatching between the non-magnetic layer 50 and the second ferromagnetic layer 70.

The first NiAl layer 40 and the second NiAl layer 60 each may have a thickness t of, for example, $0<t\leq0.63$ nm. When the thickness t is too large, there is a likelihood of spin scattering occurring in electrons moving from the first ferromagnetic layer 30 (the second ferromagnetic layer 70) to the second ferromagnetic layer 70 (the first ferromagnetic layer 30). When the thickness t is within the above-described range, spin scattering in the moving electrons is suppressed, lattice mismatching between the first ferromagnetic layer 30 and the non-magnetic layer 50 is reduced, and lattice mismatching between the non-magnetic layer 50 and the second ferromagnetic layer 70 is reduced. When the lattice mismatching between the layers is reduced, the MR ratio of the magnetoresistance effect element 101 is improved.

(Non-Magnetic Layer)

The non-magnetic layer 50 is made of a non-magnetic metal. A material of the non-magnetic layer 50 may be, for example, Cu, Au, Ag, Al, Cr, or the like. The non-magnetic layer 50 preferably contains one or more elements selected from the group consisting of Cu, Au, Ag, Al, and Cr as the main constituent element. The "main constituent element" indicates that a proportion occupied by Cu, Au, Ag, Al, and Cr is 50% or more in the compositional formula. The non-magnetic layer 50 preferably contains Ag, and preferably contains Ag as the main constituent element. Since Ag has a long spin diffusion length, the MR ratio of the magnetoresistance effect element 101 using Ag is further increased.

The non-magnetic layer 50 may have a thickness in a range of, for example, 1 nm or more and 10 nm or less. The non-magnetic layer 50 hinders magnetic coupling between the first ferromagnetic layer 30 and the second ferromagnetic layer 70.

Also, the non-magnetic layer 50 may be an insulator or a semiconductor. The non-magnetic insulator may be, for example, a material such as $Al_2O_3$, $SiO_2$, MgO, $MgAl_2O_4$, or a material in which a portion of Al, Si, and Mg of the materials described above is substituted with Zn, Be, or the like. These materials have a large band gap and are excellent in insulating properties. When the non-magnetic layer 50 is formed of a non-magnetic insulator, the non-magnetic layer 50 is a tunnel barrier layer. The non-magnetic semiconductor may be, for example, Si, Ge, $CuInSe_2$, $CuGaSe_2$, $Cu(In, Ga)Se_2$, or the like.

(Cap Layer)

The cap layer 80 is positioned on a side of the magnetoresistance effect element 101 opposite to the substrate 10. The cap layer 80 is provided to protect the second ferromagnetic layer 70. The cap layer 80 suppresses diffusion of atoms from the second ferromagnetic layer 70. Also, the cap layer 80 also contributes to crystal orientations of each layer of the magnetoresistance effect element 101. When the cap layer 80 is provided, magnetizations of the first ferromagnetic layer 30 and the second ferromagnetic layer 70 are stabilized, and the MR ratio of the magnetoresistance effect element 101 can be improved.

The cap layer 80 preferably contains a material having high conductivity so that it can be used as an electrode for causing a detection current to flow therethrough. The cap layer 80 may contain, for example, one or more metal elements of Ru, Ag, Al, Cu, Au, Cr, Mo, Pt, W, Ta, Pd, and Ir, alloys of these metal elements, or a laminate of materials consisting of two or more types of these metal elements.

Next, a method of manufacturing the magnetoresistance effect element 101 according to the present embodiment will be described. The magnetoresistance effect element 101 can be obtained by laminating, for example, the underlayers 20 (the first underlayer 21, the second underlayer 22, and the third underlayer 23), the first ferromagnetic layer 30, the first NiAl layer 40, the non-magnetic layer 50, the second NiAl layer 60, the second ferromagnetic layer 70, and the cap layer 80 on the substrate 10 in this order. As a method for film formation of each layer, for example, a sputtering method, a vapor deposition method, a laser ablation method, or a molecular beam epitaxy (MBE) method can be used.

Also, the substrate 10 may be annealed after forming the underlayers 20 or after laminating the second ferromagnetic layer 70. The annealing enhances crystalline properties of each layer.

The laminate formed of the first ferromagnetic layer 30, the non-magnetic layer 50, and the second ferromagnetic layer 70 constituting the magnetoresistance effect element 101 has a columnar shape. The laminate can be formed in various shapes such as a circle, a square, a triangle, a polygon, and the like in a plan view, and can be manufactured by a known method such as photolithography or ion beam etching.

As described above, the magnetoresistance effect element 101 according to the present embodiment uses the above-described Heusler alloy for at least one of the first ferromagnetic layer 30 and the second ferromagnetic layer 70. As described above, in the Heusler alloy according to the present embodiment, the composition or the crystal structure is not easily changed even after it undergoes annealing or the like and its state can be maintained. A change in composition or crystal structure of the Heusler alloy decreases a spin polarization of the Heusler alloy and causes a decrease in the MR ratio of the magnetoresistance effect element. Since a state change of the Heusler alloy does not easily occur even after it undergoes an annealing treatment, the MR ratio of the magnetoresistance effect element 101 is improved.

Second Embodiment

Figure 3:
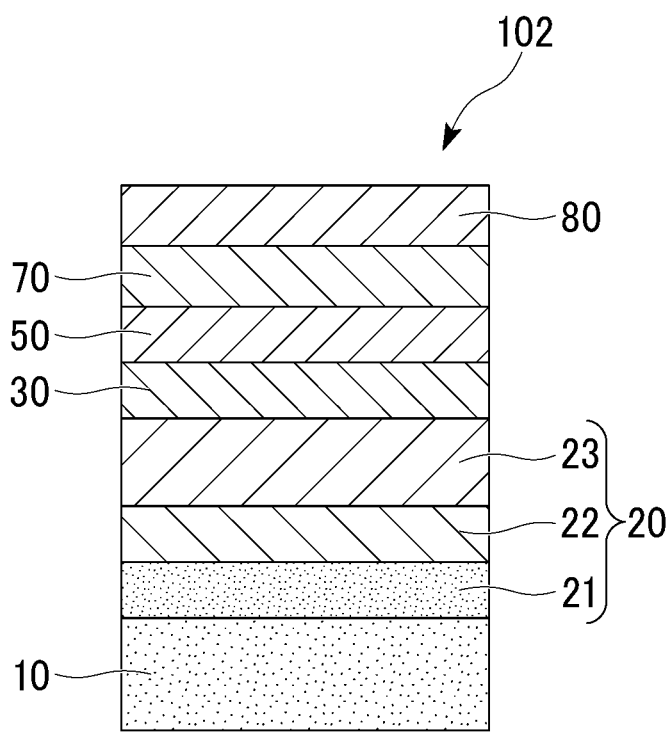
FIG. 3 is a cross-sectional view of a magnetoresistance effect element according to a second embodiment.

FIG. 3 is a cross-sectional view of a magnetoresistance effect element according to a second embodiment. A magnetoresistance effect element 102 is different from the magnetoresistance effect element 101 illustrated in FIG. 1 in that the first NiAl layer 40 and the second NiAl layer 60 are not provided. In FIG. 3, constituents the same as those in FIG. 1 will be denoted by the same references, and description thereof will be omitted.

In the magnetoresistance effect element 102 of the second embodiment, at least one of a first ferromagnetic layer 30 and a second ferromagnetic layer 70 is the Heusler alloy described above. The magnetoresistance effect element 102 of the second embodiment achieves the same effects as in the magnetoresistance effect element 101 of the first embodiment. Also, the magnetoresistance effect element 102 of the second embodiment does not include a first NiAl layer and a second NiAl layer, and the first ferromagnetic layer 30, a non-magnetic layer 50, and the second ferromagnetic layer 70 are in direct contact with each other. A magnetoresistance effect is caused by a change in relative angle between magnetization directions of the two ferromagnetic layers sandwiching the non-magnetic layer therebetween. An MR ratio is improved by directly sandwiching the non-magnetic layer 50 between the first ferromagnetic layer 30 and the second ferromagnetic layer 70. Also, layers exhibiting the magnetoresistance effect are three layers of the first ferromagnetic layer 30, the second ferromagnetic layer 70, and the non-magnetic layer 50, and thus a total thickness of the magnetoresistance effect element 102 is reduced. When a thickness of one magnetoresistance effect element 102 is reduced, a large number of elements can be provided in a same region, and the element is suitable for high recording density. Also, since steps of forming the first NiAl layer 40 and the second NiAl layer 60 are not required, a manufacturing process is simplified.

Third Embodiment

Figure 4:
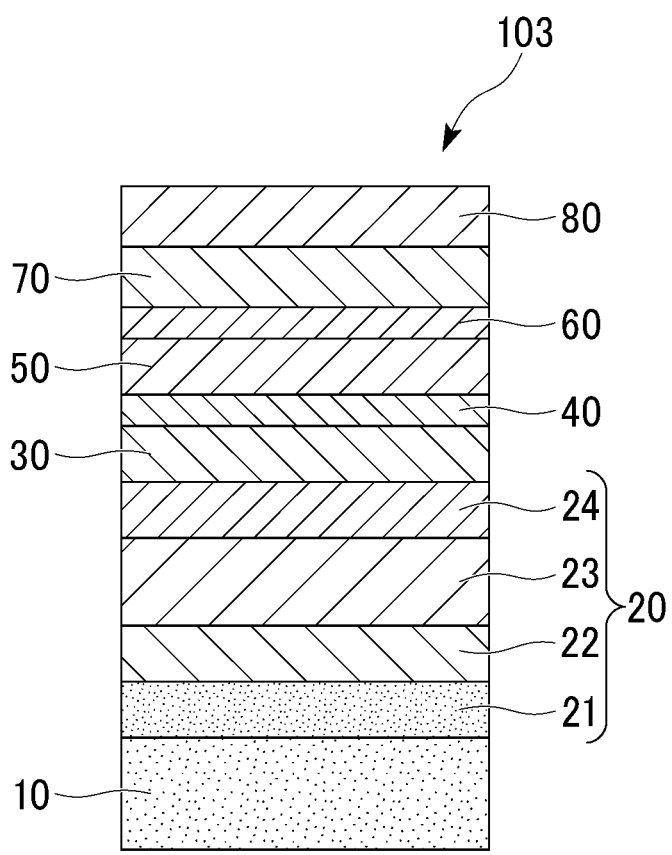
FIG. 4 is a cross-sectional view of a magnetoresistance effect element according to a third embodiment.

FIG. 4 is a cross-sectional view of a magnetoresistance effect element according to a third embodiment. A magnetoresistance effect element 103 is different from the magnetoresistance effect element 101 illustrated in FIG. 1 in that underlayers 20 include a fourth underlayer 24. Therefore, in FIG. 4, constituents the same as those in FIG. 1 will be denoted by the same references, and description thereof will be omitted.

The fourth underlayer 24 is disposed between a third underlayer 23 and a first ferromagnetic layer 30. The fourth underlayer 24 functions as a seed layer that enhances crystalline properties of the first ferromagnetic layer 30 laminated on the underlayers 20. The fourth underlayer 24 may be, for example, an alloy containing Co and Fe. When the first ferromagnetic layer 30 is a Heusler alloy, magnetization stability in the vicinity of a laminated interface is low. On the other hand, the alloy containing Co and Fe has high magnetization stability and has high lattice matching with the Heusler alloy forming the first ferromagnetic layer 30. In the magnetoresistance effect element 103 in which the alloy containing Co and Fe is used for the fourth underlayer 24, since magnetization of the Heusler alloy forming the first ferromagnetic layer 30 is further stabilized, an MR ratio is improved also at room temperature. The alloy containing Co and Fe may be, for example, Co—Fe or Co—Fe—B.

Although embodiments of the present disclosure have been described in detail with reference to the drawings, configurations, combinations thereof, or the like in the respective embodiments are examples, and additions, omissions, substitutions, and other changes to the configurations can be made within a scope not departing from the gist of the present disclosure.

The magnetoresistance effect elements 101, 102, and 103 according to the respective embodiments can be used for various applications. The magnetoresistance effect elements 101, 102, and 103 according to the respective embodiments can be applied to, for example, a magnetic head, a magnetic sensor, a magnetic memory, a high-frequency filter, or the like.

Next, application examples of the magnetoresistance effect element according to the present embodiment will be described. Further, in the following application examples, the magnetoresistance effect element 101 of the first embodiment is used as the magnetoresistance effect element, but the magnetoresistance effect element is not limited thereto. For example, in the following application examples, the same effects can be obtained also when, for example, the magnetoresistance effect element 102 of the second embodiment and the magnetoresistance effect element 103 of the third embodiment are used.

Figure 5:
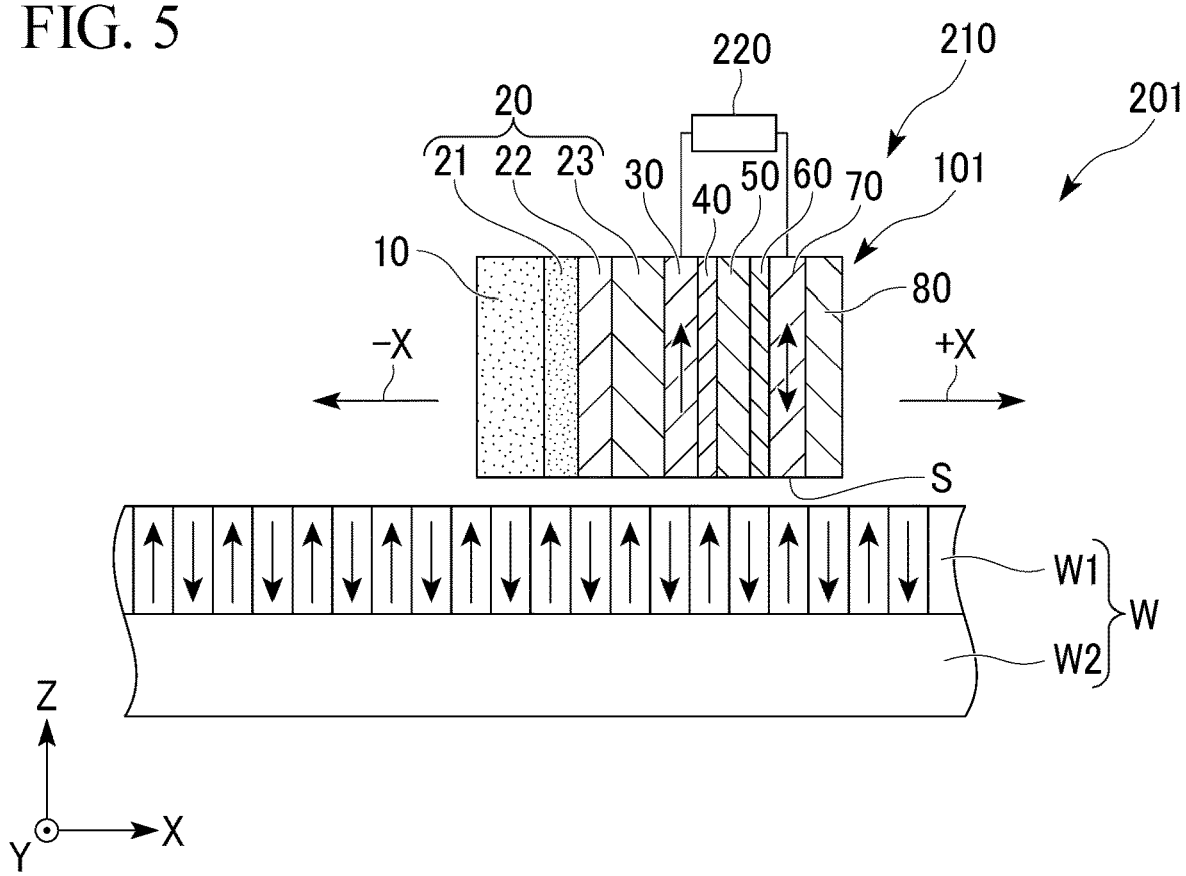
FIG. 5 is a cross-sectional view of a magnetic recording device according to application example 1.

FIG. 5 is a cross-sectional view of a magnetic recording device according to application example 1. FIG. 5 is a cross-sectional view of the magnetoresistance effect element 101 along the lamination direction of the layers of the magnetoresistance effect element.

As illustrated in FIG. 5, a magnetic recording device 201 includes a magnetic head 210 and a magnetic recording medium W. In FIG. 5, one direction in which the magnetic recording medium W extends is referred to as an X direction, and a direction perpendicular to the X direction is referred to as a Y direction. An XY plane is parallel to a main surface of the magnetic recording medium W. A direction connecting the magnetic recording medium W and the magnetic head 210 and perpendicular to the XY plane is referred to as a Z direction.

The magnetic head 210 has an air bearing surface (air bearing surface, medium facing surface) S facing a surface of the magnetic recording medium W. The magnetic head 210 moves in directions of arrow +X and arrow −X along the surface of the magnetic recording medium W at a position separated by a fixed distance from the magnetic recording medium W. The magnetic head 210 includes the magnetoresistance effect element 101 that acts as a magnetic sensor, and a magnetic recording unit (not illustrated). A resistance measuring device 220 is connected to the first ferromagnetic layer 30 and the second ferromagnetic layer 70 of the magnetoresistance effect element 101.

The magnetic recording unit applies a magnetic field to a recording layer W1 of the magnetic recording medium W and determines a magnetization direction of the recording layer W1. That is, the magnetic recording unit performs magnetic recording on the magnetic recording medium W. The magnetoresistance effect element 101 reads information of the magnetization of the recording layer W1 written by the magnetic recording unit.

The magnetic recording medium W includes the recording layer W1 and a backing layer W2. The recording layer W1 is a portion which performs magnetic recording, and the backing layer W2 is a magnetic path (magnetic flux passage) which recirculates a writing magnetic flux to the magnetic head 210 again. The recording layer W1 records magnetic information as a magnetization direction.

The second ferromagnetic layer 70 of the magnetoresistance effect element 101 is a magnetization free layer. Therefore, the second ferromagnetic layer 70 exposed on the air bearing surface S is affected by magnetization recorded in the facing recording layer W1 of the magnetic recording medium W. For example, in FIG. 5, a magnetization direction of the second ferromagnetic layer 70 is oriented in a +z direction by being affected by magnetization of the recording layer W1 oriented in the +z direction. In this case, magnetization directions of the first ferromagnetic layer 30 which is a magnetization fixed layer and the second ferromagnetic layer 70 are parallel to each other.

Here, resistance when magnetization directions of the first ferromagnetic layer 30 and the second ferromagnetic layer 70 are parallel is different from resistance when magnetization directions of the first ferromagnetic layer 30 and the second ferromagnetic layer 70 are antiparallel. Therefore, information on the magnetization of the recording layer W1 can be read as a change in resistance value by measuring resistances of the first ferromagnetic layer 30 and the second ferromagnetic layer 70 using the resistance measuring device 220.

A shape of the magnetoresistance effect element 101 of the magnetic head 210 is not particularly limited. For example, in order to avoid an influence of a leakage magnetic field of the magnetic recording medium W with respect to the first ferromagnetic layer 30 of the magnetoresistance effect element 101, the first ferromagnetic layer 30 may be installed at a position away from the magnetic recording medium W.

The magnetoresistance effect element 101 used in the magnetic head 210 includes the first ferromagnetic layer 30 and the second ferromagnetic layer 70 which are the Heusler alloys described above and thus has a high MR ratio. The magnetic head 210 reads data using a change in resistance value of the magnetoresistance effect element 101, and when the MR ratio of the magnetoresistance effect element 101 increases, erroneous recognition of data or the like does not easily occur.

Figure 6:
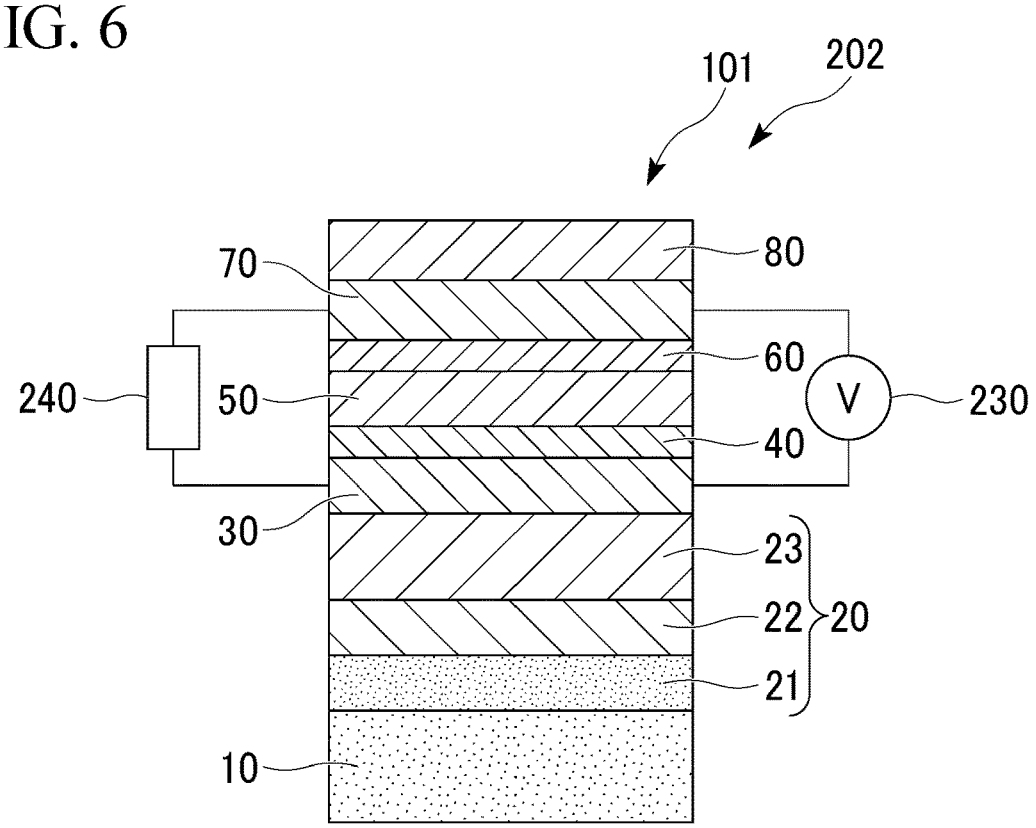
FIG. 6 is a cross-sectional view of a magnetic recording element according to application example 2.

FIG. 6 is a cross-sectional view of a magnetic recording element according to application example 2. FIG. 6 is a cross-sectional view of the magnetoresistance effect element 101 along the lamination direction of the layers of the magnetoresistance effect element.

As illustrated in FIG. 6, a magnetic recording element 202 includes the magnetoresistance effect element 101, a power supply 230 and a measurement unit 240 which are connected to the first ferromagnetic layer 30 and the second ferromagnetic layer 70 of the magnetoresistance effect element 101. When the third underlayer 23 of the underlayers 20 has conductivity, the power supply 230 and the measurement unit 240 may be connected to the third underlayer 23 instead of the first ferromagnetic layer 30. Also, when the cap layer 80 has conductivity, the power supply 230 and the measurement unit 240 may be connected to the cap layer 80 instead of the second ferromagnetic layer 70. The power supply 230 applies a potential difference to the magnetoresistance effect element 101 in the lamination direction. The measurement unit 240 measures a resistance value of the magnetoresistance effect element 101 in the lamination direction.

When a potential difference is generated between the first ferromagnetic layer 30 and the second ferromagnetic layer 70 by the power supply 230, a current flows in the lamination direction of the magnetoresistance effect element 101. The current is spin-polarized during passing through the first ferromagnetic layer 30 and becomes a spin-polarized current. The spin-polarized current reaches the second ferromagnetic layer 70 via the non-magnetic layer 50. Magnetization of the second ferromagnetic layer 70 receives a spin transfer torque (STT) due to the spin-polarized current, and the magnetization is reversed. That is, the magnetic recording element 202 illustrated in FIG. 6 is a spin transfer torque (STT) type magnetic recording element.

When a relative angle between a magnetization direction of the first ferromagnetic layer 30 and a magnetization direction of the second ferromagnetic layer 70 changes, a resistance value of the magnetoresistance effect element 101 in the lamination direction changes. The magnetic recording element 202 reads the resistance value in the lamination direction of the magnetoresistance effect element 101 using the measurement unit 240. The magnetoresistance effect element 101 in which the first ferromagnetic layer 30 and the second ferromagnetic layer 70 are the Heusler alloys described above has a high MR ratio. When the MR ratio of the magnetoresistance effect element 101 is high, a difference between a resistance value indicating data "1" and a resistance value indicating data "0" becomes large, and thus erroneous reading of the data can be suppressed.

Figure 7:
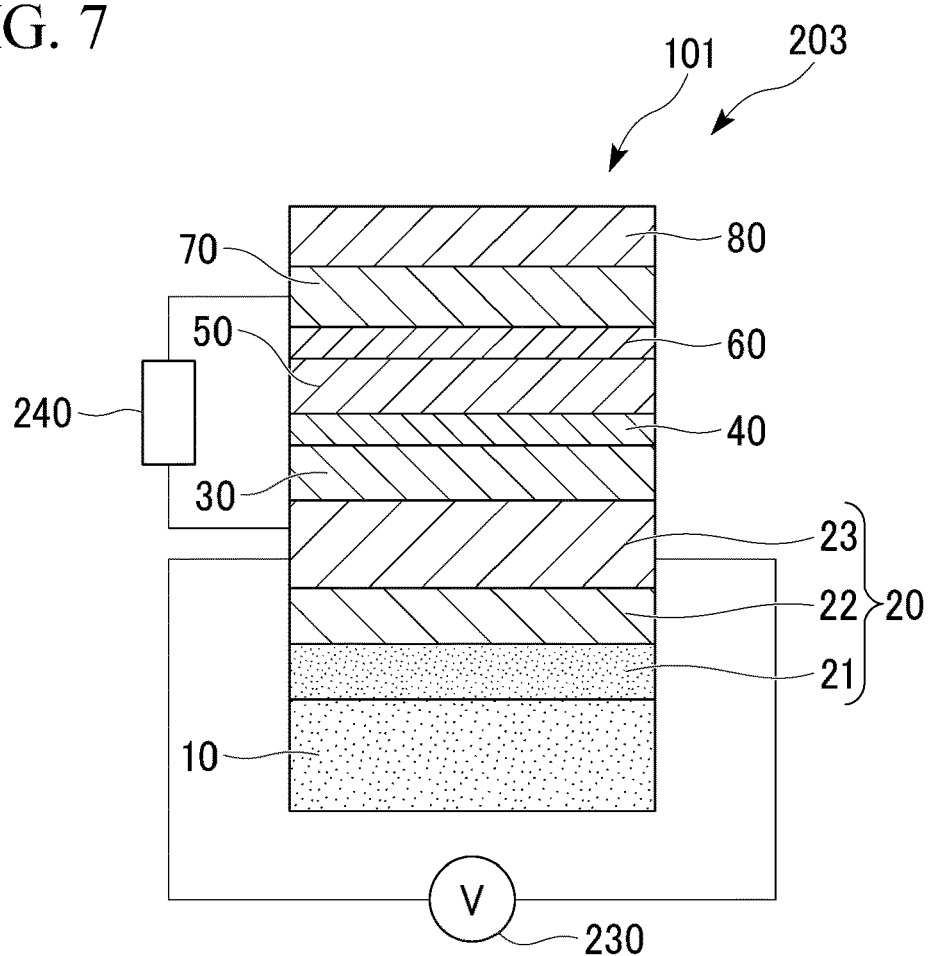
FIG. 7 is a cross-sectional view of a magnetic recording element according to application example 3.

FIG. 7 is a cross-sectional view of a magnetic recording element according to application example 3. FIG. 7 is a cross-sectional view of the magnetoresistance effect element 101 taken along the lamination direction of the layers of the magnetoresistance effect element.

As illustrated in FIG. 7, a magnetic recording element 203 includes the magnetoresistance effect element 101, the power supply 230 connected to both ends of the third underlayer 23 of the magnetoresistance effect element 101, and the measurement unit 240 connected to the third underlayer 23 and the second ferromagnetic layer 70. The third underlayer 23 is a layer containing any one of a metal, an alloy, an intermetallic compound, a metal boride, a metal carbide, a metal silicide, and a metal phosphide which have a function of generating a spin current due to a spin Hall effect when a current flows therethrough. The third underlayer 23 may be, for example, a layer containing a non-magnetic metal having an atomic number of 39 or higher having d electrons or f electrons in the outermost shell. Also, when the cap layer 80 has conductivity, the measurement unit 240 may be connected to the cap layer 80 instead of the second ferromagnetic layer 70. The power supply 230 is connected to a first end and a second end of the third underlayer 23. The power supply 230 applies a potential difference in an in-plane direction between one end portion (the first end) of the third underlayer 23 and an end portion (the second end) thereof on a side opposite to the first end. The measurement unit 240 measures a resistance value of the magnetoresistance effect element 101 in the lamination direction. In the magnetoresistance effect element 101 illustrated in FIG. 7, the first ferromagnetic layer 30 is a magnetization free layer and the second ferromagnetic layer 70 is a magnetization fixed layer.

When a potential difference is generated between the first end and the second end of the third underlayer 23 by the power supply 230, a current flows along the third underlayer 23. When a current flows along the third underlayer 23, a spin Hall effect occurs due to a spin-orbit interaction. The spin Hall effect is a phenomenon in which moving spins are bent in a direction perpendicular to a direction in which a current flows. The spin Hall effect produces uneven distribution of spins in the third underlayer 23 and induces a spin current in a thickness direction of the third underlayer 23. The spins are injected into the first ferromagnetic layer 30 from the third underlayer 23 by the spin current.

The spins injected into the first ferromagnetic layer 30 impart a spin-orbit torque (SOT) to magnetization of the first ferromagnetic layer 30. The first ferromagnetic layer 30 receives the spin-orbit torque (SOT), and the magnetization is reversed. That is, the magnetic recording element 203 illustrated in FIG. 7 is a spin-orbit torque (SOT) type magnetic recording element.

When a magnetization direction of the first ferromagnetic layer 30 and a magnetization direction of the second ferromagnetic layer 70 change, a resistance value of the magnetoresistance effect element 101 in the lamination direction changes. The resistance value of the magnetoresistance effect element 101 in the lamination direction is read by the measurement unit 240. The magnetoresistance effect element 101 in which the first ferromagnetic layer 30 and the second ferromagnetic layer 70 are the Heusler alloys described above has a high MR ratio. When the MR ratio of the magnetoresistance effect element 101 is high, a difference between a resistance value indicating data "1" and a resistance value indicating data "0" becomes large, and thus erroneous reading of the data can be suppressed.

Figure 8:
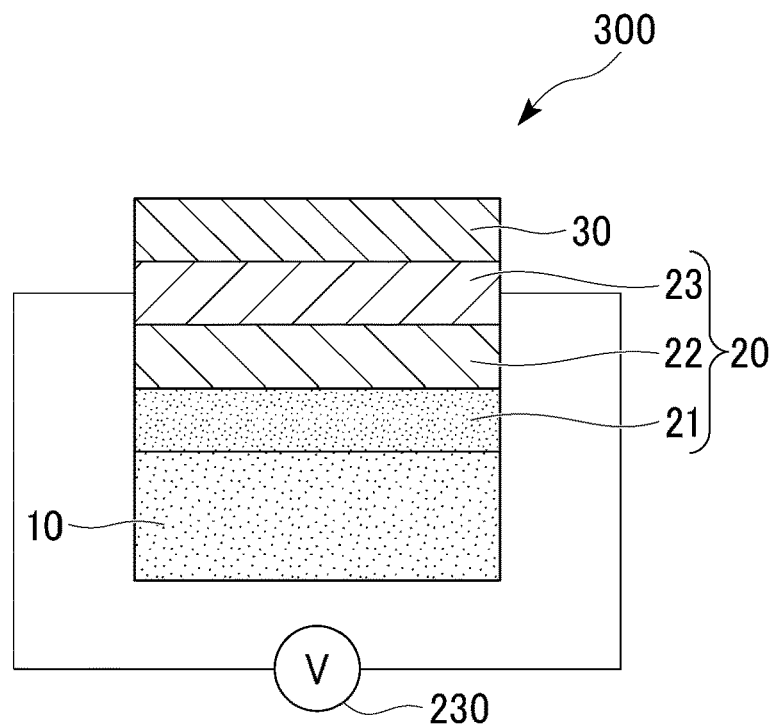
FIG. 8 is a cross-sectional view of a spin current magnetization rotational element according to application example 4.

FIG. 8 is a cross-sectional view of a spin current magnetization rotational element according to application example 4.

A spin current magnetization rotational element 300 is obtained by removing the first NiAl layer 40, the non-magnetic layer 50, the second NiAl layer 60, the second ferromagnetic layer 70, and the cap layer 80 from the magnetic recording element 203 illustrated in FIG. 7.

When a potential difference is generated between the first end and the second end of the third underlayer 23 by the power supply 230, a current flows along the third underlayer 23. When a current flows along the third underlayer 23, a spin Hall effect occurs due to a spin-orbit interaction. The spins injected from the third underlayer 23 impart a spin-orbit torque (SOT) to magnetization of the first ferromagnetic layer 30. A magnetization direction of the first ferromagnetic layer 30 changes due to the spin-orbit torque (SOT).

When a magnetization direction of the first ferromagnetic layer 30 changes, polarization of reflected light changes due to a magnetic Kerr effect. Also, when a magnetization direction of the first ferromagnetic layer 30 changes, polarization of transmitted light changes due to a magnetic Faraday effect. The spin current magnetization rotational element 300 can be used as an optical element utilizing the magnetic Kerr effect or the magnetic Faraday effect.

In the spin current magnetization rotational element 300, the first ferromagnetic layer 30 is the Heusler alloy described above. In the Heusler alloy described above, the composition or the crystal structure is not easily changed even after it undergoes annealing or the like and its characteristics can be kept. Generally, a Heusler alloy has a lower damping constant and magnetization is easily rotated compared to an FeCo alloy. When the characteristics of the Heusler alloy are maintained, a magnetization direction of the first ferromagnetic layer 30 can be changed with a low current density.

Figure 9:
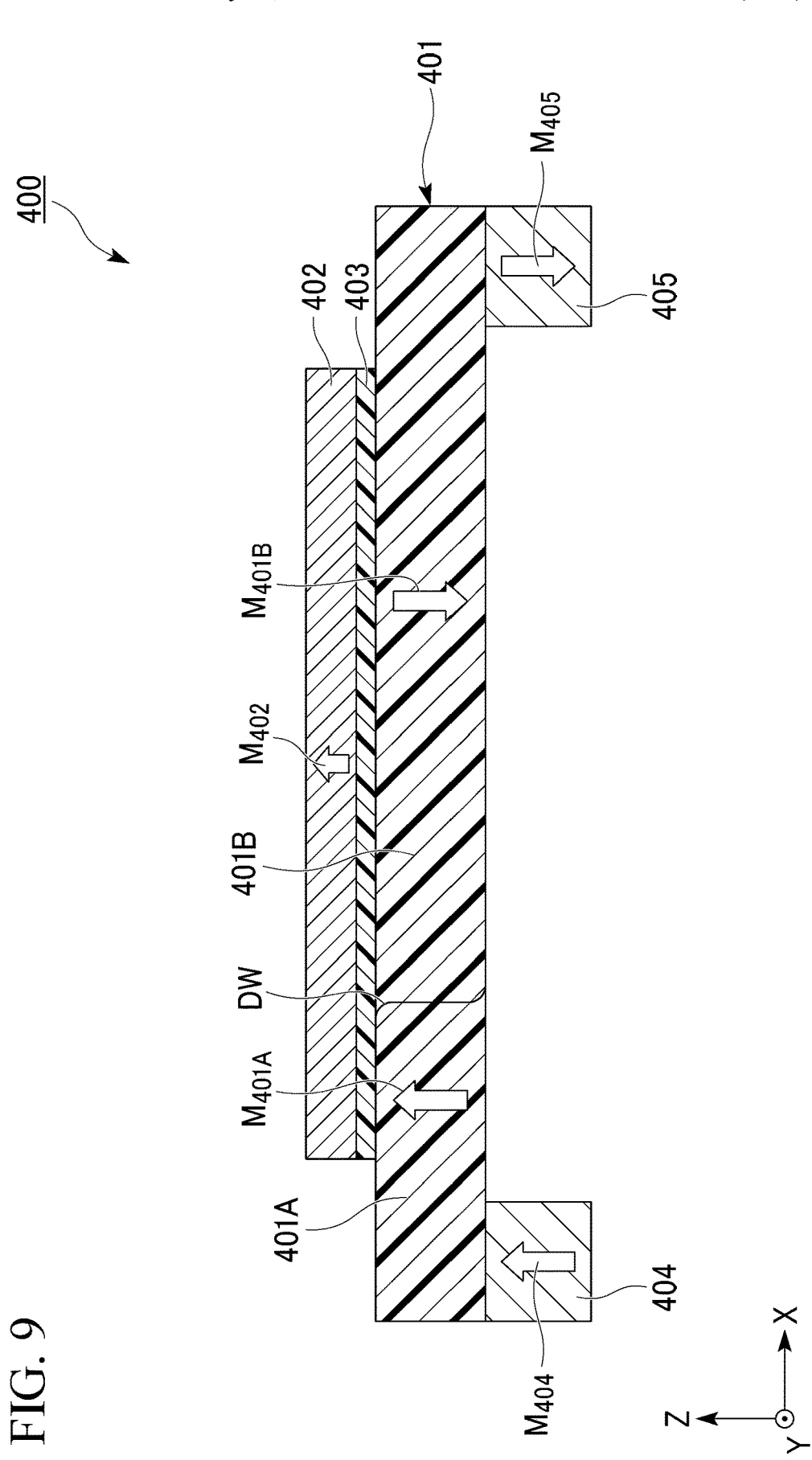
FIG. 9 is a cross-sectional view of a magnetic domain wall movement element according to application example 5.

FIG. 9 is a cross-sectional view of a magnetic domain wall movement element (magnetic domain wall displacement type magnetic recording element) according to application example 5. A magnetic domain wall displacement type magnetic recording element 400 includes a first ferromagnetic layer 401, a second ferromagnetic layer 402, a non-magnetic layer 403, a first magnetization fixed layer 404, and a second magnetization fixed layer 405. In FIG. 9, a direction in which the first ferromagnetic layer 401 extends is referred to as an X direction, a direction perpendicular to the X direction is referred to as a Y direction, and a direction perpendicular to an XY plane is referred to as a Z direction.

The non-magnetic layer 403 is sandwiched between the first ferromagnetic layer 401 and the second ferromagnetic layer 402 in the Z direction. The first magnetization fixed layer 404 and the second magnetization fixed layer 405 are connected to the first ferromagnetic layer 401 at a position sandwiching the second ferromagnetic layer 402 and the non-magnetic layer 403 in the X direction.

The first ferromagnetic layer 401 is a layer in which information can be magnetically recorded according to a change in internal magnetic state. The first ferromagnetic layer 401 includes a first magnetic domain 401A and a second magnetic domain 401B therein. Magnetization of the first ferromagnetic layer 401 at a position overlapping the first magnetization fixed layer 404 or the second magnetization fixed layer 405 in the Z direction is fixed in one direction. Magnetization of the first ferromagnetic layer 401 at a position overlapping the first magnetization fixed layer 404 in the Z direction is fixed, for example, in a +Z direction, and magnetization of the first ferromagnetic layer 401 at a position overlapping the second magnetization fixed layer 405 in the Z direction is fixed, for example, in a −Z direction. As a result, a magnetic domain wall DW is formed at a boundary between the first magnetic domain 401A and the second magnetic domain 401B. The first ferromagnetic layer 401 can have the magnetic domain wall DW therein. In the first ferromagnetic layer 401 illustrated in FIG. 9, a magnetization $M_{401A}$ of the first magnetic domain 401A is oriented in the +Z direction, and a magnetization $M_{401B}$ of the second magnetic domain 401B is oriented in the −Z direction.

The magnetic domain wall displacement type magnetic recording element 400 can record data in a multi-valued or consecutive manner by the position of the magnetic domain wall DW of the first ferromagnetic layer 401. The data recorded in the first ferromagnetic layer 401 is read as a change in resistance value of the magnetic domain wall displacement type magnetic recording element 400 when a read current is applied.

Proportions of the first magnetic domain 401A and the second magnetic domain 401B in the first ferromagnetic layer 401 change when the magnetic domain wall DW moves. A magnetization $M_{402}$ of the second ferromagnetic layer 402 may be oriented, for example, in the same direction (parallel) as the magnetization $M_{401A}$ of the first magnetic domain 401A, and in an opposite direction (antiparallel) to the magnetization $M_{401B}$ of the second magnetic domain 401B. When the magnetic domain wall DW moves in the +X direction and an area of the first magnetic domain 401A in a portion overlapping the second ferromagnetic layer 402 in a plan view from the z direction increases, a resistance value of the magnetic domain wall displacement type magnetic recording element 400 decreases. In contrast, when the magnetic domain wall DW moves in the −X direction and an area of the second magnetic domain 401B in a portion overlapping the second ferromagnetic layer 402 in a plan view from the Z direction increases, a resistance value of the magnetic domain wall displacement type magnetic recording element 400 increases.

The magnetic domain wall DW moves when a write current is caused to flow in the x direction of the first ferromagnetic layer 401 or an external magnetic field is applied. For example, when a write current (for example, a current pulse) is applied to the first ferromagnetic layer 401 in the +X direction, since electrons flow in the −X direction that is opposite to a direction of the current, the magnetic domain wall DW moves in the −X direction. When a current flows from the first magnetic domain 401A toward the second magnetic domain 401B, electrons spin-polarized in the second magnetic domain 401B causes the magnetization $M_{401A}$ the first magnetic domain 401A to be reversed. When the magnetization $M_{401A}$ the first magnetic domain 401A is reversed, the magnetic domain wall DW moves in the −X direction.

As a material of the first ferromagnetic layer 401 and the second ferromagnetic layer 402, for example, the Heusler alloy described above may be used. Any one of the first ferromagnetic layer 401 and the second ferromagnetic layer 402 may be, for example, a metal selected from the group consisting of Cr, Mn, Co, Fe, and Ni, an alloy containing one or more of these metals, an alloy containing these metals and at least one element of B, C, and N, or the like. Specifically, Co—Fe, Co—Fe—B, and Ni—Fe are exemplary examples.

The non-magnetic layer 403 can use a material the same as that of the non-magnetic layer 50 described above. A material the same as that of the second ferromagnetic layer 402 can be used for the first magnetization fixed layer 404 and the second magnetization fixed layer 405. The first magnetization fixed layer 404 and the second magnetization fixed layer 405 may have a SAF structure.

The magnetic domain wall displacement type magnetic recording element 400 in which at least one of the first ferromagnetic layer 401 and the second ferromagnetic layer 402 is the above-mentioned Heusler alloy exhibits a high MR ratio. When the MR ratio of the magnetic domain wall displacement type magnetic recording element 400 is high, a difference between a maximum value and a minimum value of the resistance value of the magnetic domain wall displacement type magnetic recording element 400 increases, and reliability of data is improved. Also, when an RA of the magnetic domain wall displacement type magnetic recording element 400 is large, a moving speed of the magnetic domain wall DW becomes slow and data can be recorded more in an analog manner. In order to increase the RA of the magnetic domain wall displacement type magnetic recording element 400, it is preferable that at least one of the first ferromagnetic layer 401 and the second ferromagnetic layer 402 satisfy general expression (3).

Figure 10:
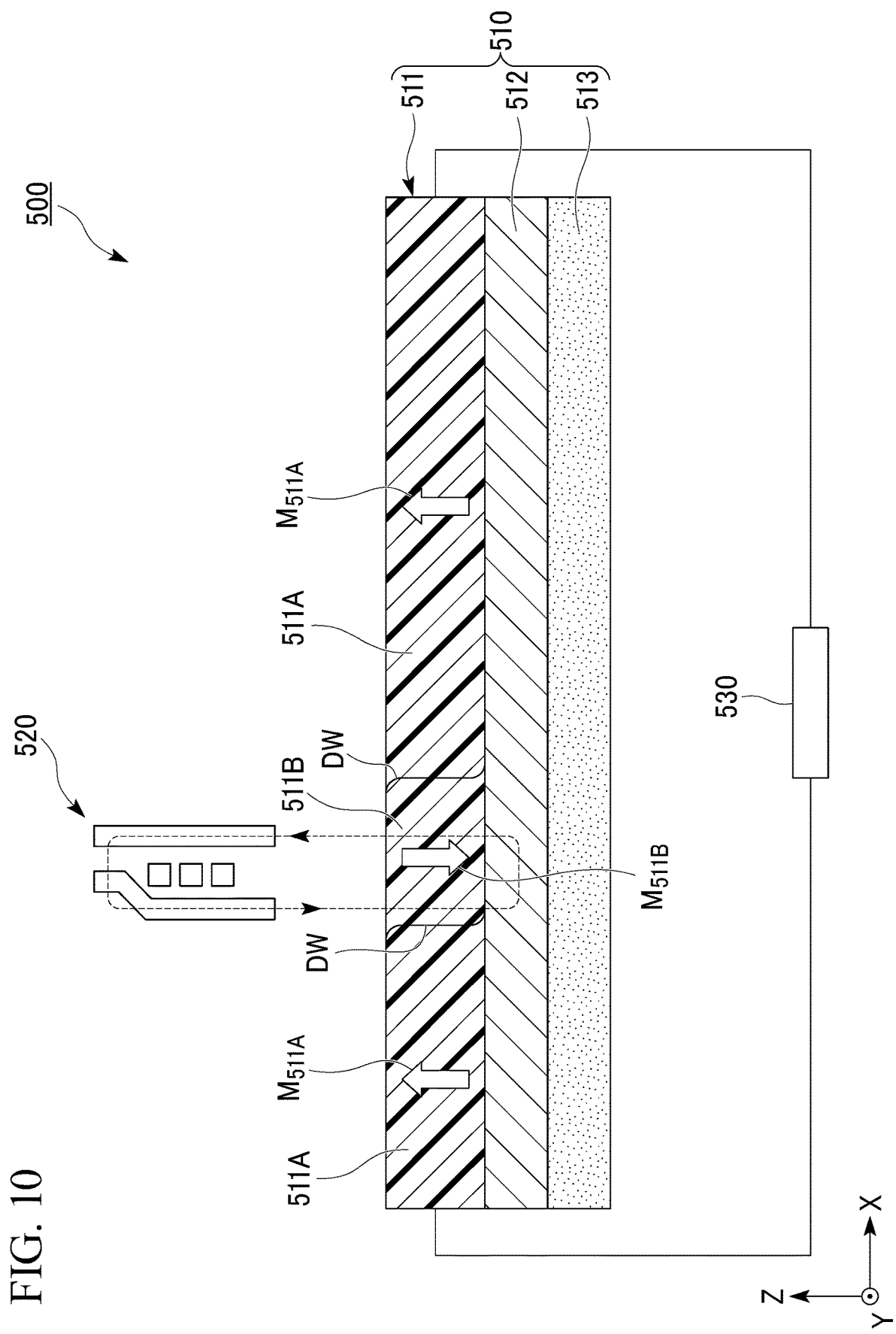
FIG. 10 is a cross-sectional view of a magnetic domain wall movement element according to application example 6.

FIG. 10 is a perspective view of a magnetic domain wall movement element (magnetic strip device) according to application example 6.

As illustrated in FIG. 10, a magnetic strip device 500 includes a magnetic recording medium 510, a magnetic recording head 520, and a pulse power supply 530. The magnetic recording head 520 is provided at a predetermined position above the magnetic recording medium 510. The pulse power supply 530 is connected to the magnetic recording medium 510 so that a pulse current can be applied in an in-plane direction of the magnetic recording medium 510. Further, in FIG. 10, one direction in which the magnetic recording medium 510 extends is referred to as an X direction, a direction perpendicular to the X direction is referred to as a Y direction, and a direction perpendicular to an XY plane is referred to as a Z direction.

The magnetic recording medium 510 includes a magnetic strip 511, an underlayer 512, and a substrate 513. The underlayer 512 is laminated on the substrate 513, and the magnetic strip 511 is laminated on the underlayer 512. The magnetic strip 511 is formed in a strip shape having a length in the X direction larger than the width in the Y direction.

The magnetic strip 511 is formed of a magnetic material capable of forming a magnetic domain having a magnetization direction different from that of the other portion in a part of a longitudinal direction. The magnetic strip 511 may include, for example, a first magnetic domain 511A and a second magnetic domain 511B. A magnetization $M_{511B}$ of the second magnetic domain 511B is oriented in a direction different from a magnetization $M_{511A}$ of the first magnetic domain 511A. A magnetic domain wall DW is formed between the first magnetic domain 511A and the second magnetic domain 511B. The second magnetic domain 511B is generated by the magnetic recording head 520.

The magnetic strip device 500 performs data writing by changing the position of the second magnetic domain 511B of the magnetic strip 511 using a magnetic field or spin injection magnetization reversal generated by the magnetic recording head 520 while intermittently shifting and moving the magnetic domain wall DW of the magnetic strip 511 by a pulse current supplied from the pulse power supply 530. The data written in the magnetic strip device 500 can be read by utilizing a magnetoresistance change or a magneto-optical change. When the magnetoresistance change is used, a ferromagnetic layer is provided at a position facing the magnetic strip 511 with a non-magnetic layer sandwiched therebetween. The magnetoresistance change is caused by a difference in relative angle between magnetization of the ferromagnetic layer and magnetization of the magnetic strip 511.

The Heusler alloy described above can be used as a material of the magnetic strip 511. When the magnetic strip 511 is the Heusler alloy described above, a decrease in performance of the Heusler alloy due to annealing or the like can be suppressed. For example, since the Heusler alloy has a lower damping constant and magnetization is easily rotated compared to an FeCo alloy, the magnetic domain wall DW can be moved with a low current density. Also, when the Heusler alloy satisfying general expression (3) is used for the magnetic strip 511, an RA of the magnetic strip device 500 can be increased.

As a material of the underlayer 512, ferrite, which is an oxide insulator, more specifically, soft ferrite is preferably used in at least a part thereof. As the soft ferrite, Mn—Zn ferrite, Ni—Zn ferrite, Mn—Ni ferrite, Ni—Zn—Co ferrite can be used. Since the soft ferrite has a high magnetic permeability and a magnetic flux of a magnetic field generated by the magnetic recording head 520 is concentrated thereon, the soft ferrite can efficiently form the second magnetic domain 511B. A material the same as that of the substrate 10 described above can be used for the substrate 513.

Figure 11:
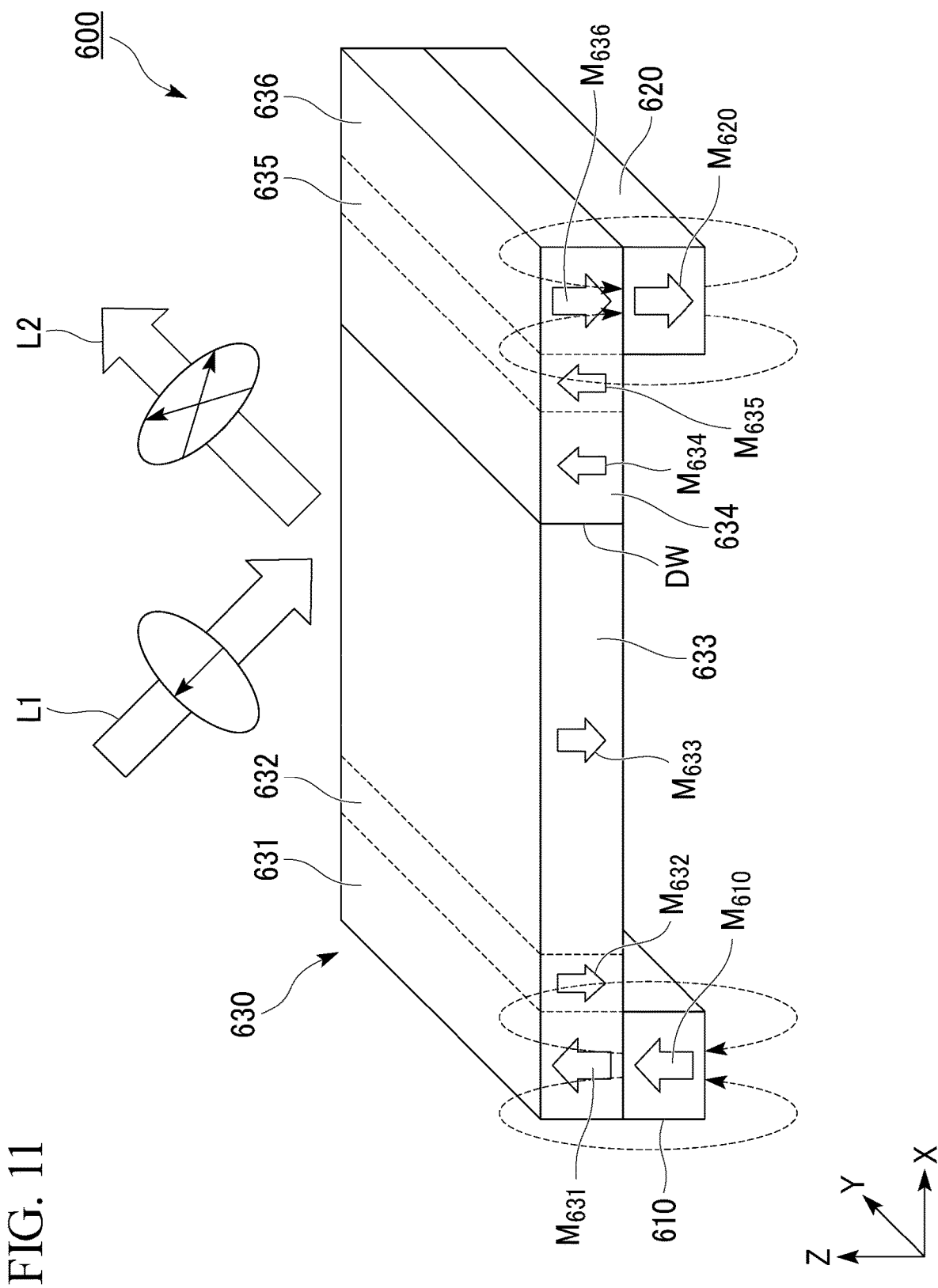
FIG. 11 is a cross-sectional view of a magnetic domain wall movement element according to application example 7.

FIG. 11 is a perspective view of a magnetic domain wall movement element (magnetic domain wall movement type spatial light modulator) according to application example 7.

As illustrated in FIG. 11, a magnetic domain wall movement type spatial light modulator 600 includes a first magnetization fixed layer 610, a second magnetization fixed layer 620, and a light modulation layer 630. In FIG. 11, one direction in which the light modulation layer 630 extends is referred to as an X direction, a direction perpendicular to the X direction is referred to as a Y direction, and a direction perpendicular to an XY plane is referred to as a Z direction.

A magnetization $M_{610}$ of the first magnetization fixed layer 610 and a magnetization $M_{620}$ of the second magnetization fixed layer 620 are oriented in different directions. For example, the magnetization $M_{610}$ of the first magnetization fixed layer 610 may be oriented in a +Z direction, and the magnetization $M_{620}$ of the second magnetization fixed layer 620 may be oriented in a −Z direction.

The light modulation layer 630 can be divided into overlapping regions 631 and 636, initial magnetic domain regions 632 and 635, and magnetic domain change regions 633 and 634.

The overlapping region 631 is a region overlapping the first magnetization fixed layer 610 in the Z direction, and the overlapping region 636 is a region overlapping the second magnetization fixed layer 620 in the Z direction. A magnetization $M_{631}$ of the overlapping region 631 is affected by a leakage magnetic field from the first magnetization fixed layer 610 and may be fixed, for example, in the +Z direction. A magnetization $M_{636}$ of the overlapping region 636 is affected by a leakage magnetic field from the second magnetization fixed layer 620 and may be fixed, for example, in the −Z direction.

The initial magnetic domain regions 632 and 635 are regions whose magnetizations are fixed in directions different from those of the overlapping regions 631 and 636 by being affected by leakage magnetic fields from the first magnetization fixed layer 610 and the second magnetization fixed layer 620. A magnetization $M_{632}$ of the initial magnetic domain region 632 is affected by a leakage magnetic field from the first magnetization fixed layer 610 and may be fixed, for example, in the −Z direction. A magnetization $M_{635}$ of the initial magnetic domain region 635 is affected by a leakage magnetic field from the second magnetization fixed layer 620 and may be fixed, for example, in the +Z direction.

The magnetic domain change regions 633 and 634 are regions in which the magnetic domain wall DW can move. A magnetization $M_{633}$ of the magnetic domain change region 633 and a magnetization $M_{634}$ of the magnetic domain change region 634 are oriented in opposite directions with the magnetic domain wall DW sandwiched therebetween. The magnetization $M_{633}$ of the magnetic domain change region 633 is affected by the initial magnetic domain region 632 and may be oriented, for example, in the −Z direction. The magnetization $M_{634}$ of the magnetic domain change region 634 is affected by a leakage magnetic field of the initial magnetic domain region 635 and may be fixed, for example, in the +Z direction. A boundary between the magnetic domain change region 633 and the magnetic domain change region 634 is the magnetic domain wall DW. The magnetic domain wall DW moves when a write current is caused to flow in the X direction of the light modulation layer 630 or an external magnetic field is applied.

The magnetic domain wall movement type spatial light modulator 600 changes the position of the magnetic domain wall DW while moving the magnetic domain wall DW intermittently. Then, a light L1 is made incident on the light modulation layer 630, and a light L2 reflected by the light modulation layer 630 is evaluated. Polarization states of the light L2 reflected by portions having different orientation directions of magnetization are different. The magnetic domain wall movement type spatial light modulator 600 can be used as a video display device utilizing a difference in polarization state of the light L2.

As a material of the light modulation layer 630, the Heusler alloy described above can be used. The elements constituting the Heusler alloy do not easily diffuse due to annealing or the like, and thus performance of the Heusler alloy described above does not easily deteriorate. For example, since the Heusler alloy has a lower damping constant and magnetization is easily rotated compared to an FeCo alloy, the magnetic domain wall DW can be moved with a low current density. Also, when the Heusler alloy satisfying general expression (3) is used for the light modulation layer 630, an RA of the magnetic domain wall movement type spatial light modulator 600 can be increased. As a result, the position of the magnetic domain wall DW can be controlled more precisely, and a video display with higher definition is possible.

The same material as the above-described first magnetization fixed layer 404 and the second magnetization fixed layer 405 can be used for the first magnetization fixed layer 610 and the second magnetization fixed layer 620.

Figure 12:
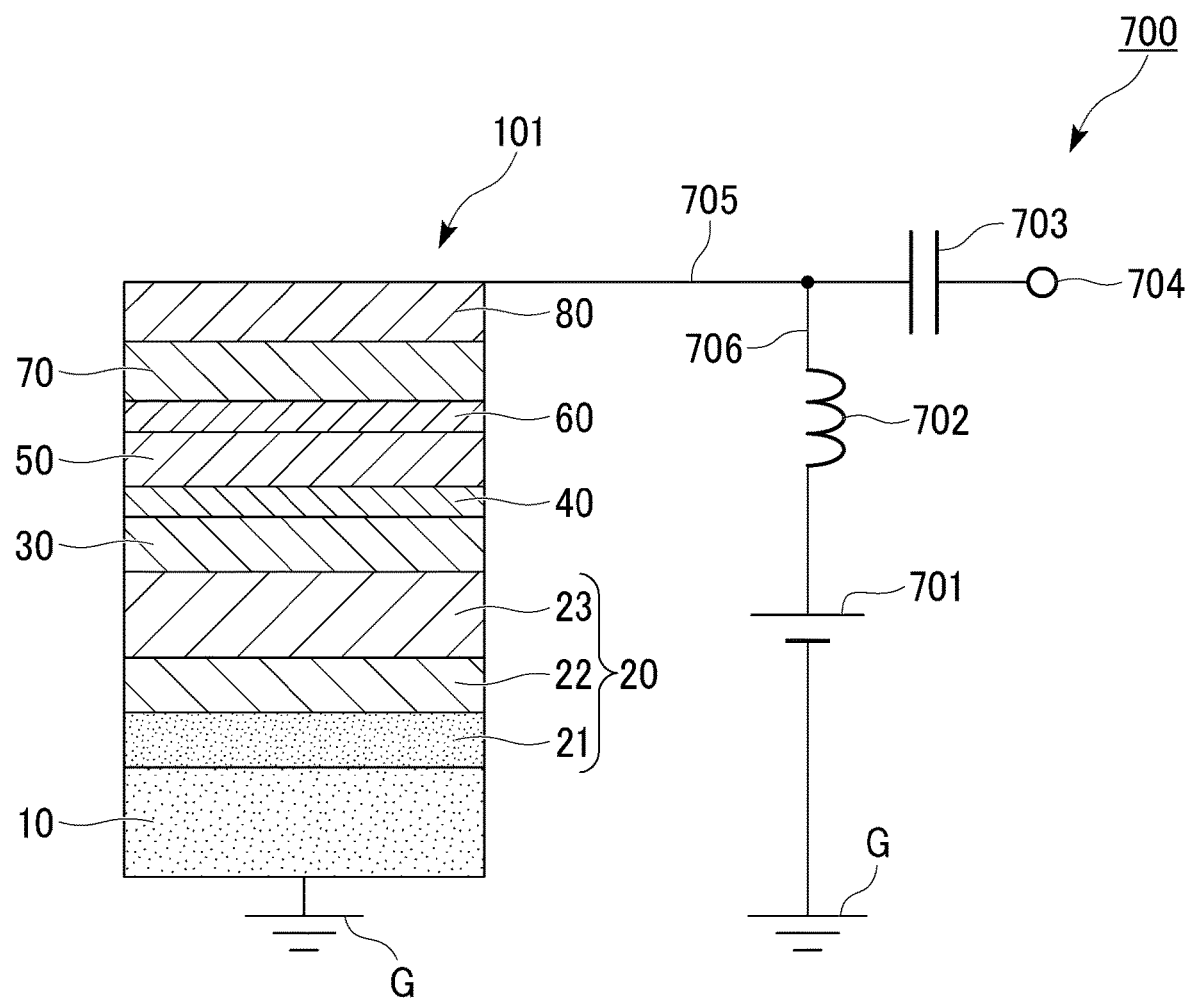
FIG. 12 is a cross-sectional view of a magnetic domain wall movement element according to application example 8.

FIG. 12 is a perspective view of a high-frequency device according to application example 8.

As illustrated in FIG. 12, a high-frequency device 700 includes the magnetoresistance effect element 101, a direct current (DC) power supply 701, an inductor 702, a capacitor 703, an output port 704, and wirings 705 and 706.

The wiring 705 connects the magnetoresistance effect element 101 and the output port 704. The wiring 706 branches from the wiring 705 and reaches the ground G via the inductor 702 and the DC power supply 701. For the DC power supply 701, the inductor 702, and the capacitor 703, known ones can be used. The inductor 702 cuts a high-frequency component of a current and passes an invariant component of the current. The capacitor 703 passes a high-frequency component of a current and cuts an invariant component of the current. The inductor 702 is disposed at a portion in which a flow of the high-frequency current is desired to be suppressed, and the capacitor 703 is disposed at a portion in which a flow of the DC current is desired to be suppressed.

When an alternating current (AC) or an alternating magnetic field is applied to the ferromagnetic layer included in the magnetoresistance effect element 101, magnetization of the second ferromagnetic layer 70 performs precessional motion. Magnetization of the second ferromagnetic layer 70 oscillates strongly when a frequency of a high-frequency current or a high-frequency magnetic field applied to the second ferromagnetic layer 70 is near a ferromagnetic resonance frequency of the second ferromagnetic layer 70, and does not oscillate as much at a frequency away from the ferromagnetic resonance frequency of the second ferromagnetic layer 70. This phenomenon is called a ferromagnetic resonance phenomenon.

The resistance value of the magnetoresistance effect element 101 changes according to an oscillation of the magnetization of the second ferromagnetic layer 70. The DC power supply 701 applies a DC current to the magnetoresistance effect element 101. The DC current flows in the lamination direction of the magnetoresistance effect element 101. The DC current flows to the ground G through the wirings 706 and 705 and the magnetoresistance effect element 101. The potential of the magnetoresistance effect element 101 changes according to Ohm's law. A high-frequency signal is output from the output port 704 according to a change in potential (change in resistance value) of the magnetoresistance effect element 101.

At least one of the first ferromagnetic layer 30 and the second ferromagnetic layer 70 is the Heusler alloy described above. Since the elements constituting the Heusler alloy do not easily diffuse due to annealing or the like, performance of the Heusler alloy described above does not easily deteriorate. For example, the Heusler alloy has a lower damping constant compared to an FeCo alloy, and magnetization can be processed with a smaller amount of energy. Also, when the MR ratio of the magnetoresistance effect element 101 is high, an intensity of a high-frequency signal oscillated from the magnetoresistance effect element 101 can be made high.

EXAMPLES

Example 1

The magnetoresistance effect element 101 illustrated in FIG. 1 was fabricated as shown below. The configurations of the layers were as follows.

Substrate 10: MgO single crystal substrate, thickness 0.5 mm

Underlayers 20: Layered structure of First under layer 21 and Second under layer 22 and Third under layer 23

First underlayer 21: MgO, thickness 10 nm

Second underlayer 22: CoFe, thickness 10 nm

Third underlayer 23: Ag, thickness 50 nm

First ferromagnetic layer 30: $Co_2(Fe_{0.9}Ta_{0.1})_{1.03}Ga_{0.42}Ge_{0.85}$, thickness 15 nm First NiAl layer 40: thickness 0.21 nm Non-magnetic layer 50: Ag, thickness 5 nm Second NiAl layer 60: thickness 0.21 nm Second ferromagnetic layer 70: $Co_2(Fe_{0.9}Ta_{0.1})_{1.03}Ga_{0.42}Ge_{0.85}$, thickness 5 nm Cap layer 80: Ru layer, thickness 5 nm The first underlayer 21 (MgO layer) was deposited by heating the substrate 10 to 500° C. and using a sputtering method. The substrate on which the first underlayer 21 was deposited was held at 500° C. for 15 minutes and then allowed to be cooled to room temperature. Next, the second underlayer 22 (CoFe layer) was deposited on the first underlayer 21 using a sputtering method. Next, the third underlayer 23 (Ag layer) was deposited on the second underlayer 22 using a sputtering method, and thereby the underlayers 20 were formed. The substrate 10 on which the underlayers 20 were deposited was annealed at 300° C. for 15 minutes and then allowed to be cooled to room temperature.

After allowing it to be cooled, the first ferromagnetic layer 30 ($Co_2(Fe_{0.9}Ta_{0.1})_{1.03}Ga_{0.42}Ge_{0.85}$) was deposited on the underlayers 20 formed on the substrate 10. The deposition of the first ferromagnetic layer 30 was performed by a co-sputtering method using a CoFeGaGe alloy target and a Ta target as the targets.

The first NiAl layer 40 was deposited on the first ferromagnetic layer 30 using a sputtering method. Next, the non-magnetic layer 50 (Ag layer) was deposited on the first NiAl layer 40 using a sputtering method. Next, the second NiAl layer 60 was deposited on the non-magnetic layer 50 in the same manner as the first NiAl layer 40. Then, the second ferromagnetic layer 70 ($Co_2(Fe_{0.9}Ta_{0.1})_{1.03}Ga_{0.42}Ge_{0.85}$) was deposited on the second NiAl layer 60 in the same manner as the first ferromagnetic layer 30. The substrate 10 on which the second ferromagnetic layer 70 was formed was annealed at 500° C. for 15 minutes, and then allowed to be cooled to room temperature.

After allowing it to be cooled, the cap layer 80 (Ru layer) was deposited on the second ferromagnetic layer 70 formed on the substrate 10 using a sputtering method. In this way, the magnetoresistance effect element 101 illustrated in FIG. 1 was fabricated.

Further, thin film compositions of the first ferromagnetic layer 30 and the second ferromagnetic layer 70 were obtained by performing an ICP emission spectroscopy for the ferromagnetic layer single film deposited on the silicon substrate, and then deposition conditions for desired thin film compositions were determined.

The MR ratio of the fabricated magnetoresistance effect element 101 was also measured. As for the MR ratio, a change in resistance value of the magnetoresistance effect element 101 was measured by monitoring a voltage applied to the magnetoresistance effect element 101 with a voltmeter while sweeping a magnetic field from the outside to the magnetoresistance effect element 101 in a state in which a constant current is caused to flow in the lamination direction of the magnetoresistance effect element 101. The resistance value when magnetization directions of the first ferromagnetic layer 30 and the second ferromagnetic layer 70 are parallel and a resistance value when magnetization directions of the first ferromagnetic layer 30 and the second ferromagnetic layer 70 are antiparallel were measured, and the MR ratio was calculated from the obtained resistance values using the following expression. Measurement of the MR ratio was performed at 300K (room temperature).

MR ratio (%)=$(R_{AP}-R_P)/R_P \times 100$ $R_P$ is a resistance value when magnetization directions of the first ferromagnetic layer 30 and the second ferromagnetic layer 70 are parallel, and $R_{AP}$ is a resistance value when magnetization directions of the first ferromagnetic layer 30 and the second ferromagnetic layer 70 are antiparallel.

Examples 2 to 6

Examples 2 to 6 are different from example 1 in that a substitution element that is substituted with the Fe element is changed in the first ferromagnetic layer 30 and the second ferromagnetic layer 70. In example 2, $Co_2(Fe_{0.9}W_{0.1})_{1.03}Ga_{0.42}Ge_{0.85}$ was used for the first ferromagnetic layer 30 and the second ferromagnetic layer 70. In example 3, $Co_2(Fe_{0.9}Nb_{0.1})_{1.03}Ga_{0.42}Ge_{0.85}$ was used for the first ferromagnetic layer 30 and the second ferromagnetic layer 70. In example 4, $Co_2(Fe_{0.9}Mo_{0.1})_{1.03}Ga_{0.42}Ge_{0.85}$ was used for the first ferromagnetic layer 30 and the second ferromagnetic layer 70. In example 5, $Co_2(Fe_{0.9}V_{0.1})_{1.03}Ga_{0.42}Ge_{0.85}$ was used for the first ferromagnetic layer 30 and the second ferromagnetic layer 70. In example 6, $Co_2(Fe_{0.9}Cr_{0.1})_{1.03}Ga_{0.42}Ge_{0.85}$ was used for the first ferromagnetic layer 30 and the second ferromagnetic layer 70.

Examples 7 to 10

Examples 7 to 10 are different from example 1 in that a ratio of the substitution element that is substituted with the Fe element is changed in the first ferromagnetic layer 30 and the second ferromagnetic layer 70. In example 7, $Co_2(Fe_{0.8}Ta_{0.2})_{1.03}Ga_{0.42}Ge_{0.85}$ was used for the first ferromagnetic layer 30 and the second ferromagnetic layer 70. In example 8, $Co_2(Fe_{0.7}Ta_{0.3})_{1.03}Ga_{0.42}Ge_{0.85}$ was used for the first ferromagnetic layer 30 and the second ferromagnetic layer 70. In example 9, $Co_2(Fe_{0.6}Ta_{0.4})_{1.03}Ga_{0.42}Ge_{0.85}$ was used for the first ferromagnetic layer 30 and the second ferromagnetic layer 70. In example 10, $Co_2(Fe_{0.5}Ta_{0.5})_{1.03}Ga_{0.42}Ge_{0.85}$ was used for the first ferromagnetic layer 30 and the second ferromagnetic layer 70.

Examples 11 to 14

Examples 11 to 14 are different from example 1 in that a ratio of the Ge element to the Ga element is changed in the first ferromagnetic layer 30 and the second ferromagnetic layer 70. In example 11, $Co_2(Fe_{0.9}Ta_{0.1})_{1.03}Ga_{0.42}Ge_{1.00}$ was used for the first ferromagnetic layer 30 and the second ferromagnetic layer 70. In example 12, $Co_2(Fe_{0.9}Ta_{0.1})_{1.03}Ga_{0.42}Ge_{1.10}$ was used for the first ferromagnetic layer 30 and the second ferromagnetic layer 70. In example 13, $Co_2(Fe_{0.9}Ta_{0.1})_{1.03}Ga_{0.42}Ge_{1.20}$ was used for the first ferromagnetic layer 30 and the second ferromagnetic layer 70. In example 14, $Co_2(Fe_{0.9}Ta_{0.1})_{1.03}Ga_{0.42}Ge_{1.30}$ was used for the first ferromagnetic layer 30 and the second ferromagnetic layer 70.

Examples 15 and 16

Examples 15 and 16 are different from example 1 in that portions of the Ga element and the Ge element are substituted with a Mn element in the first ferromagnetic layer 30 and the second ferromagnetic layer 70. In example 15, $Co_2(Fe_{0.9}Ta_{0.1})_{1.03}Ga_{0.41}Ge_{0.21}Mn_{0.80}$ was used for the first ferromagnetic layer 30 and the second ferromagnetic layer 70. In example 16, $Co_2(Fe_{0.9}Ta_{0.1})_{1.03}Ga_{0.41}Ge_{0.21}Mn_{0.65}$ was used for the first ferromagnetic layer 30 and the second ferromagnetic layer 70.

Comparative Example 1

Comparative example 1 is different from example 1 in that the Fe element is not substituted in the first ferromagnetic layer 30 and the second ferromagnetic layer 70. In comparative Example 1, $Co_2Fe_{1.03}Ga_{0.42}Ge_{0.85}$ was used for the first ferromagnetic layer 30 and the second ferromagnetic layer 70.

Comparative Example 2

Comparative example 2 is different from example 1 in the composition ratio of each element in the first ferromagnetic layer 30 and the second ferromagnetic layer 70. In comparative example 2, $Co_2(Fe_{0.9}Ta_{0.1})_{1.03}Ga_{0.67}Ge_{0.6}$ was used for the first ferromagnetic layer 30 and the second ferromagnetic layer 70.

Comparative Example 3

Comparative example 3 is different from example 1 in that the composition ratio of each element is changed and the Fe element is not substituted in the first ferromagnetic layer 30 and the second ferromagnetic layer 70. In comparative example 3, $Co_2Fe_{1.03}Ga_{0.67}Ge_{0.6}$ was used for the first ferromagnetic layer 30 and the second ferromagnetic layer 70.

Comparative Example 4

Comparative example 4 is different from example 1 in that a ratio of the Ge element to the Ga element is changed in the first ferromagnetic layer 30 and the second ferromagnetic layer 70. In comparative example 4, $Co_2(Fe_{0.9}Ta_{0.1})_{1.03}Ga_{0.42}Ge_{0.75}$ was used.

The results of MR ratios in examples 1 to 16 and comparative examples 1 to 4 are shown in table 2 below. As shown in table 2, the magnetoresistance effect elements of examples 1 to 16 all had a higher MR ratio than the magnetoresistance effect elements of comparative examples 1 to 4. That is, it can be said that a state of the high MR ratio can be maintained in the magnetoresistance effect elements of examples 1 to 16 even after they undergo the annealing treatment at 500° C. for 15 minutes, and it can be said that a state change of the Heusler alloy due to the annealing does not occur.

TABLE 2

| | Compositional formula | MR ratio (%) |
|---|---|---|
| Example 1 | $Co_2(Fe_{0.9}Ta_{0.1})_{1.03}Ga_{0.42}Ge_{0.85}$ | 30.2 |
| Example 2 | $Co_2(Fe_{0.9}W_{0.1})_{1.03}Ga_{0.42}Ge_{0.85}$ | 32.5 |
| Example 3 | $Co_2(Fe_{0.9}Nb_{0.1})_{1.03}Ga_{0.42}Ge_{0.85}$ | 28.3 |
| Example 4 | $Co_2(Fe_{0.9}Mo_{0.1})_{1.03}Ga_{0.42}Ge_{0.85}$ | 29.4 |
| Example 5 | $Co_2(Fe_{0.9}V_{0.1})_{1.03}Ga_{0.42}Ge_{0.85}$ | 26.3 |
| Example 6 | $Co_2(Fe_{0.9}Cr_{0.1})_{1.03}Ga_{0.42}Ge_{0.85}$ | 26.1 |
| Example 7 | $Co_2(Fe_{0.8}Ta_{0.2})_{1.03}Ga_{0.42}Ge_{0.85}$ | 31.6 |
| Example 8 | $Co_2(Fe_{0.7}Ta_{0.3})_{1.03}Ga_{0.42}Ge_{0.85}$ | 30.5 |
| Example 9 | $Co_2(Fe_{0.6}Ta_{0.4})_{1.03}Ga_{0.42}Ge_{0.85}$ | 28.4 |
| Example 10 | $Co_2(Fe_{0.5}Ta_{0.5})_{1.03}Ga_{0.42}Ge_{0.85}$ | 21.0 |
| Example 11 | $Co_2(Fe_{0.9}Ta_{0.1})_{1.03}Ga_{0.42}Ge_{1.00}$ | 31.1 |
| Example 12 | $Co_2(Fe_{0.9}Ta_{0.1})_{1.03}Ga_{0.42}Ge_{1.10}$ | 31.3 |
| Example 13 | $Co_2(Fe_{0.9}Ta_{0.1})_{1.03}Ga_{0.42}Ge_{1.20}$ | 28.8 |
| Example 14 | $Co_2(Fe_{0.9}Ta_{0.1})_{1.03}Ga_{0.42}Ge_{1.30}$ | 21.1 |
| Example 15 | $Co_2(Fe_{0.9}Ta_{0.1})_{1.03}Ga_{0.41}Ge_{0.21}Mn_{0.80}$ | 25.3 |
| Example 16 | $Co_2(Fe_{0.9}Ta_{0.1})_{1.03}Ga_{0.41}Ge_{0.21}Mn_{0.65}$ | 22.8 |
| Comparative example 1 | $Co_2Fe_{1.03}Ga_{0.42}Ge_{0.85}$ | 20.2 |
| Comparative example 2 | $Co_2(Fe_{0.9}Ta_{0.1})_{1.03}Ga_{0.67}Ge_{0.6}$ | 19.2 |
| Comparative example 3 | $Co_2Fe_{1.03}Ga_{0.67}Ge_{0.6}$ | 16.5 |
| Comparative example 4 | $Co_2(Fe_{0.9}Ta_{0.1})_{1.03}Ga_{0.42}Ge_{0.75}$ | 20.4 |

Examples 17 to 21

Examples 17 to 21 are different from example 1 in that $Co_2(Fe_{0.9}Ta_{0.1})_{1.03}Ga_{0.42}Ge_{0.85}$ is used for the first ferromagnetic layer 30 and the second ferromagnetic layer 70, and thicknesses of the first NiAl layer 40 and the second NiAl layer 60 are changed. In example 17, thicknesses of the first NiAl layer 40 and the second NiAl layer 60 were 0 nm (the first NiAl layer 40 and the second NiAl layer 60 were not included). In example 18, the thicknesses of the first NiAl layer 40 and the second NiAl layer 60 were each 0.42 nm. In example 19, the thicknesses of the first NiAl layer 40 and the second NiAl layer 60 were each 0.63 nm. In example 20, the thicknesses of the first NiAl layer 40 and the second NiAl layer 60 were each 0.84 nm. In example 21, the thicknesses of the first NiAl layer 40 and the second NiAl layer 60 were each 1.05 nm.

The results of MR ratios in examples 17 to 21 are shown in table 3 below. As shown in table 3, the magnetoresistance effect elements of examples 17 to 21 all had a higher MR ratio than the magnetoresistance effect elements of comparative examples 1 to 4. That is, in the magnetoresistance effect elements of examples 17 to 21, the MR ratio can be improved when a structure using the first NiAl layer 40 and the second NiAl layer 60 is employed, and it can be said that a state of the high MR ratio can be maintained even after they undergo the annealing treatment at 500° C. for 15 minutes, and it can be said that a state change of the Heusler alloy due to the annealing does not occur.

TABLE 3

| | Compositional formula | MR ratio (%) | NiAl thickness (nm) |
|---|---|---|---|
| Example 17 | $Co_2(Fe_{0.9}Ta_{0.1})_{1.03}Ga_{0.42}Ge_{0.85}$ | 25.8 | 0 |
| Example 1 | $Co_2(Fe_{0.9}Ta_{0.1})_{1.03}Ga_{0.42}Ge_{0.85}$ | 30.2 | 0.21 |
| Example 18 | $Co_2(Fe_{0.9}Ta_{0.1})_{1.03}Ga_{0.42}Ge_{0.85}$ | 31.7 | 0.42 |
| Example 19 | $Co_2(Fe_{0.9}Ta_{0.1})_{1.03}Ga_{0.42}Ge_{0.85}$ | 30 | 0.63 |
| Example 20 | $Co_2(Fe_{0.9}Ta_{0.1})_{1.03}Ga_{0.42}Ge_{0.85}$ | 23.5 | 0.84 |
| Example 21 | $Co_2(Fe_{0.9}Ta_{0.1})_{1.03}Ga_{0.42}Ge_{0.85}$ | 20.9 | 1.05 |

EXPLANATION OF REFERENCES 101, 102, 103 Magnetoresistance effect element
10 Substrate
20 Underlayer
21 First underlayer
22 Second underlayer
23 Third underlayer
24 Fourth underlayer
30 First ferromagnetic layer
40 First NiAl layer
50 Non-magnetic layer
60 Second NiAl layer
70 Second ferromagnetic layer
80 Cap layer
201 Magnetic recording device
202, 203 Magnetic recording element
210 Magnetic head
220 Resistance measuring device
230 Power supply
240 Measurement unit
300 Spin current magnetization rotational element
400 Magnetic domain wall displacement type magnetic recording element
401 First ferromagnetic layer
402 Second ferromagnetic layer
403 Non-magnetic layer
404 First magnetization fixed layer
405 Second magnetization fixed layer
500 Magnetic strip device
510 Magnetic recording medium
511 Magnetic strip
511A First magnetic domain
511B Second magnetic domain
512 Underlayer
513 Substrate
520 Magnetic recording head
530 Pulse power supply
600 Magnetic domain wall movement type spatial light modulator
610 First magnetization fixed layer
620 Second magnetization fixed layer
630 Light modulation layer
631, 636 Overlapping region
632, 635 Initial magnetic domain region
633, 634 Magnetic domain change region
700 High-frequency device 701 Direct current (DC) power supply
702 Inductor
703 Capacitor
704 Output port
705, 706 Wiring
DW Magnetic domain wall

What is claimed is:

1. A magnetoresistance effect element comprising:
a first ferromagnetic layer;
a second ferromagnetic layer; and
a non-magnetic layer positioned between the first ferromagnetic layer and the second ferromagnetic layer,
wherein
at least one of the first ferromagnetic layer and the second ferromagnetic layer is a Heusler alloy in which a portion of elements of an alloy represented by $Co_2Fe_\alpha Z_\beta$ is substituted with a substitution element, in which
Z is one or more elements selected from the group consisting of Al, Si, Ga, Ge, and Sn,
$\alpha$ and $\beta$ satisfy $2.3 \leq \alpha+\beta$, $\alpha<\beta$, and $0.5<\alpha<1.9$, and
the substitution element is one or more elements selected from the group consisting of elements having a melting point higher than that of Fe among elements of Groups 4 to 10 of the Periodic Table.

2. The magnetoresistance effect element according to claim 1, wherein the Heusler alloy is represented by the following general expression (1), $$Co_2(Fe_{1-a}Y1_a)_\alpha Z_\beta \qquad (1)$$

and in expression (1), Y1 is the substitution element, and a satisfies $0<a<0.5$.

3. The magnetoresistance effect element according to claim 1, wherein the substitution element is one or more elements selected from the group consisting of Zr, Nb, Mo, Ru, Rh, Pd, Hf, Ta, W, Re, Os, Ir, and Pt.

4. The magnetoresistance effect element according to claim 3, wherein the substitution element is one or more elements selected from the group consisting of Hf, Ta, W, Re, Os, Ir, and Pt.

5. The magnetoresistance effect element according to claim 1, wherein
the Heusler alloy is represented by the following general expression (2), $$Co_2(Fe_{1-a}Y1_a)_\alpha(Ga_{1-b}Z1_b)_\beta \qquad (2)$$

and in expression (2), Y1 is the substitution element,
Z1 is one or more elements selected from the group consisting of Al, Si, Ge, and Sn, and
$0<a<0.5$ and $0.1 \leq \beta(1-b)$ are satisfied.

6. The magnetoresistance effect element according to claim 5, wherein b in general expression (2) satisfies $b>0.5$.

7. The magnetoresistance effect element according to claim 1, wherein
the Heusler alloy is represented by the following general expression (3), $$Co_2(Fe_{1-a}Y1_a)_\alpha(Ge_{1-c}Z2_c)_\beta \qquad (3)$$

and in expression (3), Y1 is the substitution element,
Z2 is one or more elements selected from the group consisting of Al, Si, Ga, and Sn, and
$0<a<0.5$ and $0.1 \leq \beta(1-c)$ are satisfied.

8. The magnetoresistance effect element according to claim 7, wherein c in general expression (3) satisfies $c<0.5$.

9. The magnetoresistance effect element according to claim 7, wherein Z2 is Ga.

10. The magnetoresistance effect element according to claim 1, wherein $\alpha$ and $\beta$ satisfy $2.3 \leq \alpha+\beta<2.66$.

11. The magnetoresistance effect element according to claim 1, wherein $\alpha$ and $\beta$ satisfy $2.45<\alpha+\beta<2.66$.

12. The magnetoresistance effect element according to claim 1, wherein the non-magnetic layer contains Ag.

13. The magnetoresistance effect element according to of claim 1, further comprising a NiAl layer or a NiAl alloy layer between the first ferromagnetic layer and the non-magnetic layer and between the second ferromagnetic layer and the non-magnetic layer.

14. The magnetoresistance effect element according to claim 13, wherein a thickness t of the NiAl layer is $0<t \leq 0.63$ nm.

15. A Heusler alloy in which a portion of elements of an alloy represented by $Co_2Fe_\alpha Z_\beta$ is substituted with a substitution element, wherein
Z is one or more elements selected from the group consisting of Al, Si, Ga, Ge, and Sn,
$\alpha$ and $\beta$ satisfy $2.3 \leq \alpha+\beta$, $\alpha<\beta$, and $0.5<\alpha<1.9$, and
the substitution element is one or more elements selected from the group consisting of elements having a melting point higher than that of Fe among elements of Groups 4 to 10 of the Periodic Table.

* * * * *